United States Patent
Kornbluh et al.

(10) Patent No.: US 6,882,086 B2
(45) Date of Patent: Apr. 19, 2005

(54) VARIABLE STIFFNESS ELECTROACTIVE POLYMER SYSTEMS

(75) Inventors: Roy D. Kornbluh, Palo Alto, CA (US); Ronald E. Pelrine, Boulder, CO (US)

(73) Assignee: SRI International, Menlo Park, CA (US)

( * ) Notice: Subject to any disclaimer, the term of this patent is extended or adjusted under 35 U.S.C. 154(b) by 183 days.

(21) Appl. No.: 10/053,511

(22) Filed: Jan. 16, 2002

(65) Prior Publication Data

US 2002/0175594 A1 Nov. 28, 2002

Related U.S. Application Data

(60) Provisional application No. 60/293,005, filed on May 22, 2001, now abandoned, and provisional application No. 60/327,846, filed on Oct. 5, 2001, now abandoned.

(51) Int. Cl.$^7$ ............................................. H01L 41/08
(52) U.S. Cl. ........................ 310/328; 310/330; 310/800
(58) Field of Search ........................... 310/311, 316.01, 310/317, 319, 328–332, 800

(56) References Cited

U.S. PATENT DOCUMENTS

| | | | | |
|---|---|---|---|---|
| 4,158,787 A | * | 6/1979 | Forward | 310/51 |
| 4,626,730 A | * | 12/1986 | Hubbard, Jr. | 310/326 |
| 4,849,668 A | * | 7/1989 | Crawley et al. | 310/328 |
| 4,868,447 A | * | 9/1989 | Lee et al. | 310/328 |
| 4,885,783 A | | 12/1989 | Whitehead et al. | |
| 4,980,597 A | * | 12/1990 | Iwao | 310/319 |
| 5,424,596 A | * | 6/1995 | Mendenhall et al. | 310/328 |
| 5,857,694 A | * | 1/1999 | Lazarus et al. | 280/602 |
| 5,977,685 A | | 11/1999 | Kurita et al. | |
| 6,048,276 A | * | 4/2000 | Vandergrift | 473/316 |
| 6,060,811 A | | 5/2000 | Fox et al. | |
| 6,196,935 B1 | * | 3/2001 | Spangler et al. | 473/318 |
| 6,198,204 B1 | * | 3/2001 | Pottenger | 310/326 |
| 6,249,076 B1 | | 6/2001 | Madden et al. | |
| 6,252,334 B1 | * | 6/2001 | Nye et al. | 310/328 |
| 6,486,589 B1 | * | 11/2002 | Dujari et al. | 310/331 |

OTHER PUBLICATIONS

Roy D. Kornbluh, Robotic Systems, Ocean Engineering and Marine Systems, 2000 Program, Jan. 2001, Office of Naval Research Public Release, ONR–32100–1.

Roy D. Kornbluh, Robotic Systems, Ocean Engineering and Marine Systems, 1999 Program, Feb. 2000, Office of Naval Research Public Release, ONR 32100–2.

Roy D. Kornbluh, Robotic Systems, Ocean Engineering and Marine Systems, 1998 Program, Feb. 1999 Office of Naval Research Public Release, ONR 32199–4.

Roy D. Kornbluh, Robotic Systems, Ocean Engineering and Marine Systems 1997 Program , Dec. 1997, Office of Naval Research Public Release, ONR 32198–2.

Ashley, S., "Smart Skis and Other Adaptive Structures", *Mechanical Engineering*, Nov. 1995, pp. 77–81.

(Continued)

Primary Examiner—Mark Budd
(74) Attorney, Agent, or Firm—Beyer Weaver & Thomas LLP

(57) ABSTRACT

The invention relates to systems that provide variable stiffness and/or variable damping using an electroactive polymer transducer. Systems described herein offer several techniques that provide variable and controlled stiffness and/or damping. A transducer may be implemented using open loop control, thereby providing simple systems that inactively deliver a desired stiffness and/or damping performance. Alternately, closed loop control techniques permit electroactive polymer transducer designs that actively adapt the stiffness and/or damping performance of a system. Further, transducers may be implemented in a device whose stiffness changes with deflection of the polymer.

96 Claims, 9 Drawing Sheets

OTHER PUBLICATIONS

Bar–Cohen, Yoseph, JPL, *Worldwide Electroactive Polymers, EAP (Artificial Muscles) Newsletter*, vol. 3, No. 1, Jun. 2001.

Bharti, V., H. S. Xu, G. Shanthi, and Q. M. Zhang, "Polarization and Structural Properties of High Energy Electron Irradiated Poly(vinylidene fluoride–trifluoroethylene) Copolymer Films," to be published in J. Appl. Phys. (2000).

Bobbio, S., M Kellam, B. Dudley, S. Goodwin Johansson, S. Jones, J. Jacobson, F. Tranjan, and T. DuBois, "Integrated Force Arrays," in Proc. IEEE Micro ElectroMechanical Systems Workshop, Fort Lauderdale, Florida Feb. 1993.

Calvert, P. and Z. Liu, "Electrically stimulated bilayer hydrogels as muscles," Proceedings of the SPIE International Symposium on Smart Structures and Materials: Electro–Active Polymer Actuators and Devices, Mar. 1–2, 1999, Newport Beach, California, USA, pp. 236–241.

Elhami, K., and B. Gauthier–Manuel, "Electrostriction Of The Copolymer Of Vinylidene–Fluoride And Trifluoroethylene," *J. Appl. Phys.* vol. 77(8), 3987–3990, Apr. 15, 1995.

Hirose, S., Biologically Inspired Robots: Snake–like Locomotors and Manipulators, *"Development of the ACM as a Manipulator"*, Oxford University Press, New York, 1993, pp. 170–172.

Kornbluh, R., G. Andeen, and J. Eckerle, "Artificial Muscle: The Next Generation of Robotic Actuators," presented at the Fourth World Conference on Robotics Research, SME Paper M591–331, Pittsburgh, PA, Sep. 17–19, 1991.

Kornbluh, R., R. Pelrine, J. Joseph, "Elastomeric Dielectric Artificial Muscle Actuators for Small Robots," *Proceedings of the Third IASTED International Conference on Robotics and Manufacturing*, Jun. 14–16, 1995, Cancun, Mexico.

Kornbluh, R., Pelrine, R., Eckerie, J., Joseph, J., "Electrostrictive Polymer Artificial Muscle Actuators", IEEE International Conference on Robotics and Automation, Leuven, Belgium, 1998.

Kornbluh, R., R. Pelrine, Jose Joseph, Richard Heydt, Qibing Pei, Seiki Chiba, 1999. "High–Field Electrostriction Of Elastomeric Polymer Dielectrics For Actuation", Proceedings of the SPIE International Symposium on Smart Structures and Materials: Electro–Active Polymer Actuators and Devices, Mar. 1–2, 1999, Newport Beach, California, USA. pp. 149–161.

Kornbluh, R. D and R. E. Pelrine., Kornbluh, R., R. Pelrine, Q. Pei, S. Oh, and J. Joseph, 2000, "Ultrahigh Strain Response of Field–Actuated Elastomeric Polymers," Proceedings of the 7*th* SPIE Symposium on Smart Structures and Materials–Electroactive Polymers and Devices (EAPAD) Conference, Mar. 6–8, 2000, Newport Beach, California, USA, pp. 51–64.

Liu, C., Y. Bar–Cohen, and S. Leary, "Electro–statically stricted polymers (ESSP)," Proceedings of the SPIE International Symposium on Smart Structures and Materials: Electro–Active Polymer Actuators and Devices, Mar. 1–2, 1999, Newport Beach, California, USA., pp. 186–190.

Ohara, K., M. Hennecke, and J. Fuhrmann, "Electrostriction of polymethylmethacrylates," *Colloid & Polymer Sci.* vol. 280, 164–168 (1982).

Pei et al., "Improved Electroactive Polymers", U.S. Appl. No. 09/619,847, filed Jul. 20, 2000, 70 pages.

Pelrine, R., R. Kornbluh, and Q. Pei. "Electroactive Polymer Transducers And Actuators", U.S. Appl. No. 09/620,025, filed Jul. 20, 2001, 58 pages.

Pelrine, R. and Kornbluh, "Electroactive Polymer Devices," U.S. Appl. No. 09/619,846, filed Jul. 20, 2000, 69 pages.

Pelrine, R, R. Kornbluh, J. Joseph, and S. Chiba, "Electrostriction of Polymer Films for Microactuators," *Proc. IEEE Tenth Annual International Workshop on Micro Electro Mechanical Systems*, Nagoya, Japan, Jan. 26–30, 1997, pp. 238–243.

Pelrine, R., R. Kornbluh, and J. Eckerle, "Energy Efficient Electroactive Polymers and Electroactive Polymer Devices", U.S. Appl. No. 09/779,373, filed Feb. 7, 2001.

Pelrine, R., R. Kornbluh, and J. Joseph, FY 1998 *Final Report on Artificial Muscle for Small Robots*, ITAD–3482–FR–99–36, SRI International, Menlo Park, California, 1999.

Pelrine, R., R. Kornbluh, and J. Joseph, FY 1999 *Final Report on Artificial Muscle for Small Robots*, ITAD–10162–FR–00–27, SRI International, Menlo Park, California, 2000.

Pelrine, R., R. Kornbluh, Q. Pei, and J. Joseph, "High Speed Electrically Actuated Elastomers with Over 100% Strain," *Science*, vol. 287, No. 5454, pp. 1–21, 2000.

Pelrine, R., Roy Kornbluh, Jose Joseph, Qibing Pei, Seiki Chiba "Recent Progress in Artificial Muscle Micro Actuators,", SRI International, Tokyo, 1999 MITI/NEEDOIM-NIC, 1999.

Pelrine, R., J. Eckerle, and S. Chiba, "Review of Artificial Muscle Approaches," invited paper, in *Proc. Third International Symposium on Micro Machine and Human Science*, Nagoya, Japan, Oct. 14–16, 1992.

Smela, E., O. Inganäs, and I. Lundström, "Controlling Folding of Micrometer–size Structures," *Science*, vol. 268, pp. 1735–1738 (Jun. 23, 1995).

Uchino, K. 1986. "Electrostrictive Actuators: Materials and Applications," *Ceramic Bulletin*, 65(4), pp. 647–652, 1986.

Pelrine et al., "Electroactive Polymer Generators", U.S. Appl. No. 09/619,848, filed Jul. 20, 2000, 69 pages.

Pelrine, R., R. Kornbluh, J. Eckerle "Monolithic Electroactive Polymers" U.S. Appl. No. 09/779,203 filed Feb. 7, 2001.

Kornbluh, R., R. Pelrine, Q. Pei and J. Eckerle "Electroactive Polymer Sensors", U.S. Appl. No. 10/007,705, filed Dec. 6, 2001.

Pelrine, R. R. Kornbluh, J. Eckerle, S. Stanford, S. Oh and P. Garcia, "Biologically Powered Electroactive Polymer Generators", U.S. Appl. No. 09/792,877, filed Feb. 23, 2001.

Lakes, R.S., "Extreme damping in compliant composites with a negative stiffness phase", Philosophical Magazine Letters, 81, 95–100 (2001).

Lakes, R.S., "Extreme Damping in Composite materials with a negative stiffness phase", Physical Review Letters 86, 2897–2900, Mar. 26 (2001).

Lakes, R.S., Lee, T., Bersie, A., and Wang Y.C., "Extreme damping in composite materials with negative stiffness inclusions", Nature, 410,565–567 Mar. (2001).

Pei, Qibing, R. Pelrine, R. Kornbluh, S. Jonasdottir, V. Shastri, R. Full, Multifunctional Electroelastomers: Electroactive Polymers Combining Structural, Actuating, and Sensing Functions, ITAD–433–PA–00–123, available at www.sri.com–publications, Jan. 17, 2001.

Kornbluh, R., R. Pelrine, Q. Pei and V. Shastri "Electroactive Polymer (EAP) Actuators as Artificial Muscles—Reality, Potential and Challenges", Chapter 16, available from SPIE Press on May 2001.

\* cited by examiner

VARIABLE STIFFNESS ELECTROACTIVE POLYMER SYSTEMS

CROSS-REFERENCE TO RELATED APPLICATION

This application claims priority under 35 U.S.C. §119(e) from U.S. Provisional Patent Application No. 60/293,005 filed May 22, 2001 now abandoned, which is incorporated by reference herein for all purposes; this application also claims priority under 35 U.S.C. §119(e) from U.S. Provisional Patent Application No. 60/327,846 entitled Enhanced Multifunctional Footwear and filed Oct. 5, 2001 now abandoned, which is incorporated by reference herein for all purposes.

BACKGROUND OF THE INVENTION

The present invention relates generally to electroactive polymer technology. More particularly, the present invention relates to electroactive polymer systems that provide electronically variable and electronically controlled stiffness and/or damping.

In many applications, it is desirable to electronically vary or control the stiffness within a system. Common techniques for providing stiffness include spring based designs that allow directionally specific compliance using one or more springs, or materials, of a known stiffness. When control is desired, these designs lose their simplicity and become complex quite readily, requiring specialized mechanisms and actuators to adapt performance.

Conventional systems for providing damping include fluid-based damping devices and other complex mechanical dampers. Again, variation in the damping applied by these devices, or damping control as desired for an application, adds a considerable amount of complexity and cost. In addition, conventional systems for providing stiffness and damping do not scale well to smaller sizes.

In view of the foregoing, alternative devices and systems that provide variable stiffness and damping without undue complexity or cost would be desirable.

SUMMARY OF THE INVENTION

The present invention relates to variable stiffness and damping systems that comprise one or more electroactive polymer transducers.

In one aspect, the present invention relates to a system for providing a desired stiffness using an electroactive polymer transducer. The system comprises a device including a mechanical interface capable of displacement. The device also comprises a transducer having at least two electrodes, and an electroactive polymer in electrical communication with the at least two electrodes and coupled to the mechanical interface. The polymer is arranged in a manner that allows deflection of the polymer corresponding to displacement of the mechanical interface. The system also comprises control electronics in electrical communication with the at least two electrodes and designed or configured to set or change the electrical state of the transducer in order to cause a corresponding setting or change in the stiffness of the device.

In another aspect, the present invention relates to a system for providing damping using an electroactive polymer transducer. The system comprises a device including a mechanical interface capable of displacement. The device also comprises a transducer having at least two electrodes, and an electroactive polymer in electrical communication with the at least two electrodes and coupled to the mechanical interface. The polymer is arranged in a manner that allows deflection of the polymer corresponding to displacement of the mechanical interface. The system also comprises control electronics in electrical communication with the at least two electrodes and designed or configured to set or change an electrical state of the transducer. The system further comprises dissipative electronics in electrical communication with the at least two electrodes and designed or configured to dump electrical energy in response to a change in the electrical state.

In yet another aspect, the present invention relates to a system for providing a desired stiffness using an electroactive polymer transducer. The system comprises a device including a mechanical interface capable of displacement. The device also comprises transducer having at least two electrodes, and an electroactive polymer in electrical communication with the at least two electrodes and coupled to the mechanical interface, the polymer arranged in a manner that allows deflection of the polymer corresponding to displacement of the mechanical interface. The system also comprises open loop control electronics in electrical communication with the at least two electrodes and designed or configured to set or change the electrical state of the transducer in order to cause a corresponding setting or change in the stiffness of the device.

In still another aspect, the present invention relates to a system for providing a desired stiffness using an electroactive polymer transducer. The system comprises a device including a mechanical interface capable of displacement. The device also comprises transducer having at least two electrodes, and an electroactive polymer in electrical communication with the at least two electrodes and coupled to the mechanical interface, the polymer arranged in a manner that allows deflection of the polymer corresponding to displacement of the mechanical interface. The system also comprises control electronics in electrical communication with the at least two electrodes and designed or configured to set or change the electrical state of the transducer in order to cause a corresponding setting or change in the stiffness of the device. The system further comprises a sensor configured to detect a parameter related to the desired stiffness and provide feedback to the control electronics. In many cases, the sensor measures force and/or motion, and stiffness is computed to provide control.

In another aspect, the present invention relates to a system for providing a desired stiffness using an electroactive polymer transducer. The system comprises a device including a transducer comprising at least two electrodes, and an electroactive polymer in electrical communication with the at least two electrodes. The system also comprises control electronics in electrical communication with the at least two electrodes and designed or configured to set or change an electrical state that results in a desired deflection for the polymer, the desired deflection corresponding to a structural state of the device that results in the desired stiffness for the device.

In still another aspect, the present invention relates to a system for providing damping using an electroactive polymer transducer. The system comprises a device including a mechanical interface capable of displacement. The device also comprises a transducer comprising at least two electrodes, and an electroactive polymer in electrical communication with the at least two electrodes and coupled to the mechanical interface. The polymer is arranged in a manner that allows deflection of the polymer corresponding to displacement of the mechanical interface. The system additionally comprises an open loop control source in electrical communication with the at least two electrodes and designed or configured to set or change an electrical state that results in a desired damping for the device. The system also comprises dissipative electronics in electrical communication with the at least two electrodes and designed or configured to dump electrical energy in response to a change in the electrical state.

In another aspect, the present invention relates to a system for providing damping using an electroactive polymer transducer. The system comprises a device including a mechanical interface capable of displacement. The device also comprises a transducer comprising at least two electrodes, and an electroactive polymer in electrical communication with the at least two electrodes and coupled to the mechanical interface. The polymer is arranged in a manner that allows deflection of the polymer corresponding to displacement of the mechanical interface. The system further comprises control electronics in electrical communication with the at least two electrodes and designed or configured to set or change an electrical state that results in a desired damping for the device. The system also comprises dissipative electronics in electrical communication with the at least two electrodes and designed or configured to dump electrical energy in response to a change in the electrical state. The system additionally comprises a sensor configured to detect a parameter related to the desired damping and provide feedback to the control electronics.

In yet another aspect, the present invention relates to a method for providing a desired stiffness using an electroactive polymer transducer. The transducer comprises at least two electrodes and an electroactive polymer in electrical communication with the at least two electrodes. The method comprises applying a substantially constant voltage to the at least two electrodes using control electronics in electrical communication with the at least two electrodes.

In still another aspect, the present invention relates to a method for providing a desired stiffness using an electroactive polymer transducer. The transducer comprises at least two electrodes an electroactive polymer in electrical communication with the at least two electrodes. The method comprises applying a substantially constant charge to the transducer using control electronics in electrical communication with the at least two electrodes.

In another aspect, the present invention relates to a method for providing a desired stiffness using an electroactive polymer transducer. The transducer comprises at least two electrodes and an electroactive polymer in electrical communication with the at least two electrodes. The method comprises applying an electrical state to the transducer, using control electronics in electrical communication with the at least two electrodes, that places the polymer in a stiffness regime corresponding to the desired stiffness.

In still another aspect, the present invention relates to a system for providing a desired stiffness for a portion of footwear. The system comprises footwear designed or configured for human usage. The footwear includes a portion capable of displacement. The footwear also includes a transducer comprising at least two electrodes, and an electroactive polymer in electrical communication with the at least two electrodes and coupled to the portion. The polymer is arranged in a manner that allows deflection of the polymer corresponding to displacement of the portion. The system also comprises control electronics in electrical communication with the at least two electrodes and designed or configured to set or change the electrical state of the transducer in order to cause a corresponding setting or change in the stiffness of the device.

In yet another aspect, the present invention relates to a method for resisting motion of a mechanical interface included in a device. The device includes an electroactive polymer transducer comprising at least two electrodes an electroactive polymer in electrical communication with the at least two electrodes and coupled to the mechanical interface. The method comprises actuating the polymer out of phase from motion of the mechanical interface that causes the polymer to contract. The method also comprises absorbing electrical energy in generator mode out of phase from motion of the mechanical interface that causes the polymer to expand.

These and other features and advantages of the present invention will be described in the following description of the invention and associated figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1A:
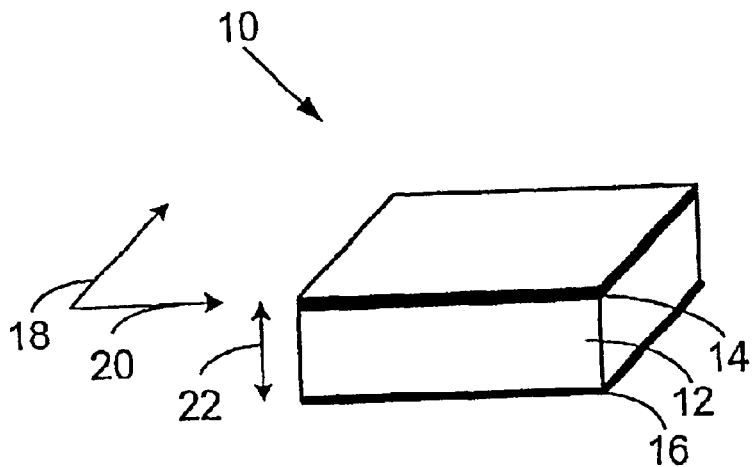
FIG. 1A illustrates a top perspective view of a transducer portion in accordance with one embodiment of the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. In some cases, descriptions of underlying physical phenomena are provided. These descriptions serve to facilitate understanding of various features of the invention; and theory is not intended to limit or bound the invention described herein in any manner.

1. Overview

The present invention relates to systems that provide variable stiffness and/or variable damping and include an electroactive polymer transducer. Electroactive polymer transducers convert between mechanical and electrical energy. A system of the present invention typically comprises an electroactive polymer, or device employing an electroactive polymer, and electronics in electrical communication with electrodes of the electroactive polymer. The electronics may include functions such as stiffness control, energy dissipation, electrical energy generation, polymer actuation, polymer deflection sensing, control logic, etc. Systems employing an electroactive polymer transducer offer several techniques for providing stiffness and/or damping control.

In one aspect, open loop techniques are used to control stiffness and/or damping of a device employing a transducer; thereby providing simple designs that deliver a desired stiffness and/or damping performance without sensor feedback. In some embodiments, control electronics in electrical communication with electrodes of the transducer supply a substantially constant charge to the electrodes. In other embodiments, the control electronics supply a substantially constant voltage to the electrodes.

In another aspect, closed loop control techniques permit electroactive polymer transducer systems that flexibly adapt stiffness and/or damping performance. As will be described in further detail below, an electroactive polymer transducer operates in 'actuator mode' when converting electrical to mechanical energy—and may be used to provide mechanical energy. When converting mechanical to electrical energy, an electroactive polymer transducer operates in 'generator mode'—and may be used to absorb mechanical energy. To resist vibrations in a closed loop design, for example, the system actively resists the vibration by repeatedly a) actuating the polymer when one wants the transducer to stretch approximately 180 degrees out of phase from the vibration, and b) absorbing electrical energy in generator mode when one wants the polymer to contract approximately 180 degrees out of phase from the vibration. The energy absorbed while in generator mode may be stored and used to supply energy in actuator mode, or for other uses.

In yet another embodiment, structural changes in a mechanical device resulting from electroactive polymer deflection are used to provide variable stiffness. For example, the desired deflection for the polymer may produce a polymer shape that results in the desired stiffness for the device.

In still another embodiment, known stiffness of an electroactive polymer at various levels of deflection are used to provide variable stiffness and damping systems. In this case, control electronics in electrical communication with an electroactive polymer apply an electrical state that places the polymer in a stiffness regime that provides a desired stiffness for the device.

2. General Structure of Electroactive Polymer Transducers

The production and absorption of mechanical energy using systems of the present invention is based on energy conversion of one or more active areas of an electroactive polymer. Electroactive polymers convert between electrical and mechanical energy. To help illustrate the performance of an electroactive polymer in converting electrical energy to mechanical energy, FIG. 1A illustrates a top perspective view of a transducer portion 10 in accordance with one embodiment of the present invention. The transducer portion 10 comprises a portion of an electroactive polymer 12 for converting between electrical energy and mechanical energy. In one embodiment, an electroactive polymer refers to a polymer that acts as an insulating dielectric between two electrodes and may deflect upon application of a voltage difference between the two electrodes. Top and bottom electrodes 14 and 16 are attached to the electroactive polymer 12 on its top and bottom surfaces, respectively, to provide a voltage difference across polymer 12, or to receive electrical energy from the polymer 12. Polymer 12 may deflect with a change in electric field provided by the top and bottom electrodes 14 and 16. Deflection of the transducer portion 10 in response to a change in electric field provided by the electrodes 14 and 16 is referred to as 'actuation'. Actuation typically involves the conversion of electrical energy to mechanical energy. As polymer 12 changes in size, the deflection may be used to produce mechanical work.

Figure 1B:
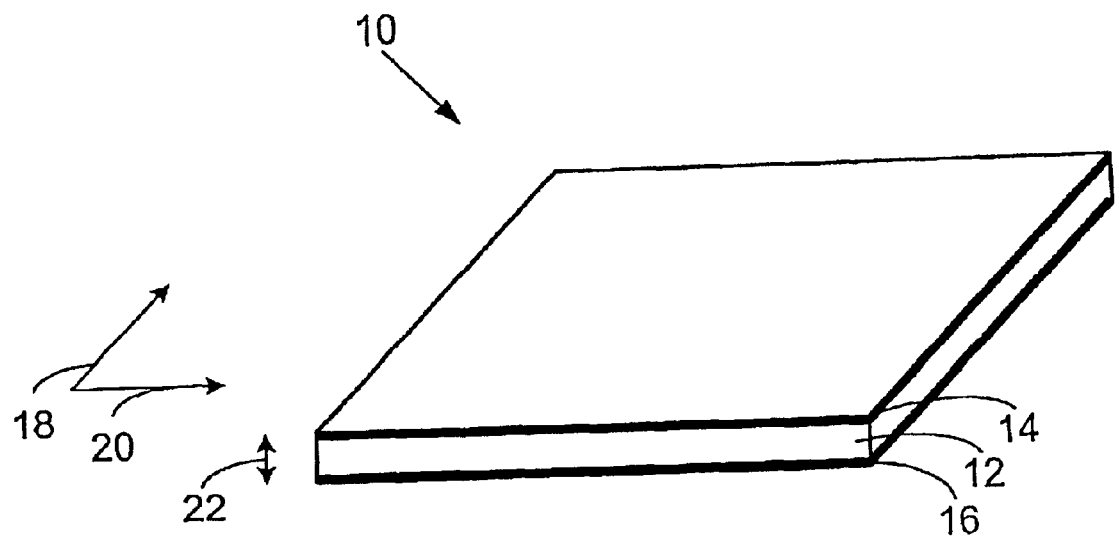
FIG. 1B illustrates a top perspective view of the transducer portion of FIG. 1A including deflection.

FIG. 1B illustrates a top perspective view of the transducer portion 10 including deflection. In general, deflection refers to any displacement, expansion, contraction, torsion, linear or area strain, or any other deformation of a portion of the polymer 12. For actuation, a change in electric field corresponding to the voltage difference applied to or by the electrodes 14 and 16 produces mechanical pressure within polymer 12. In this case, the unlike electrical charges produced by electrodes 14 and 16 attract each other and provide a compressive force between electrodes 14 and 16 and an expansion force on polymer 12 in planar directions 18 and 20, causing polymer 12 to compress between electrodes 14 and 16 and stretch in the planar directions 18 and 20.

Electrodes 14 and 16 are compliant and change shape with polymer 12. The configuration of polymer 12 and electrodes 14 and 16 provides for increasing polymer 12 response with deflection. More specifically, as the transducer portion 10 deflects, compression of polymer 12 brings the opposite charges of electrodes 14 and 16 closer and the stretching of polymer 12 separates similar charges in each electrode. In one embodiment, one of the electrodes 14 and 16 is ground. For actuation, the transducer portion 10 generally continues to deflect until mechanical forces balance the electrostatic forces driving the deflection. The mechanical forces include elastic restoring forces of the polymer 12 material, the compliance of electrodes 14 and 16, and any external resistance provided by a device and/or load coupled to the transducer portion 10, etc. The deflection of the transducer portion 10 as a result of an applied voltage may also depend on a number of other factors such as the polymer 12 dielectric constant and the size of polymer 12.

Electroactive polymers in accordance with the present invention are capable of deflection in any direction. After application of a voltage between the electrodes 14 and 16, the electroactive polymer 12 increases in size in both planar directions 18 and 20. In some cases, the electroactive polymer 12 is incompressible, e.g. has a substantially constant volume under stress. In this case, the polymer 12 decreases in thickness as a result of the expansion in the planar directions 18 and 20. It should be noted that the present invention is not limited to incompressible polymers and deflection of the polymer 12 may not conform to such a simple relationship.

FIGS. 1A and 1B may be also used to show one manner in which the transducer portion 10 converts mechanical energy to electrical energy. If the transducer portion 10 is mechanically stretched by external forces to a thinner, larger area shape such as that shown in FIG. 1B, and a relatively small voltage difference (less than that necessary to actuate the film to the configuration in FIG. 1B) is applied between electrodes 14 and 16, the transducer portion 10 will contract in area between the electrodes to a shape such as in FIG. 1A when the external forces are removed. Once the transducer portion 10 is stretched, the relatively small voltage difference is provided such that the resulting electrostatic forces are insufficient to balance the elastic restoring forces of the stretch. The transducer portion 10 therefore contracts, and it becomes thicker and has a smaller planar area in the plane defined by directions 18 and 20 (orthogonal to the thickness between electrodes). When polymer 12 becomes thicker, it separates electrodes 14 and 16 and their corresponding unlike charges, thus raising the electrical energy and voltage of the charge. Further, when electrodes 14 and 16 contract to a smaller area, like charges within each electrode compress, also raising the electrical energy and voltage of the charge. Thus, with different charges on electrodes 14 and 16, contraction from a shape such as that shown in FIG. 1B to one such as that shown in FIG. 1A raises the electrical energy of the charge. That is, mechanical deflection is being turned into electrical energy and the transducer portion 10 is acting in 'generator' mode.

When a relatively small voltage difference is applied between electrodes 14 and 16, deflection of transducer portion 10 will tend to change the voltage difference between the electrodes or drive charge to or from the electrodes, or do both, depending on the electrical state imposed on the electrodes 14 and 16. As polymer 12 changes in size, the changing electrical properties and voltage may be detected, dissipated, and/or used. For example, the change in voltage difference between the electrodes may be used to drive current to or from one of the electrodes which is dissipated through a resistor.

Some or all of the charge and energy can be removed when the transducer portion 10 is fully contracted in the plane defined by directions 18 and 20. Alternatively, some or all of the charge and energy can be removed during contraction. If the electric field pressure in the polymer increases and reaches balance with the mechanical elastic restoring forces and external load during contraction, the contraction will stop before full contraction, and no further elastic mechanical energy will be converted to electrical energy. Removing some of the charge and stored electrical energy reduces the electrical field pressure, thereby allowing contraction to continue. The exact electrical behavior of the transducer portion 10 when operating in generator mode depends on any electrical and mechanical loading as well as the intrinsic properties of polymer 12 and electrodes 14 and 16.

In some cases, electrodes 14 and 16 cover a limited portion of polymer 12 relative to the total area of the polymer. This may be done to prevent electrical breakdown around the edge of polymer 12 or to achieve customized deflections for one or more portions of the polymer. As the term is used herein, an active area is defined as a portion of a transducer comprising polymer material 12 and at least two electrodes.

Figure 1C:
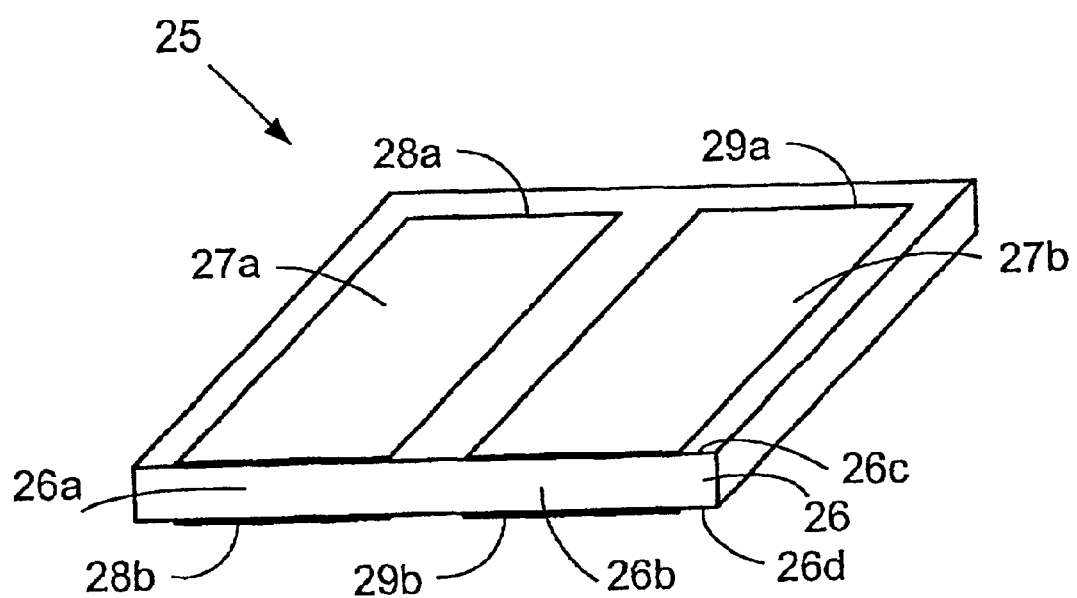
FIG. 1C illustrates a monolithic transducer 25 comprising a plurality of active areas in accordance with one embodiment of the present invention.

As the term is used herein, "monolithic" refers to electroactive polymers, transducers, and devices comprising a plurality of active areas on a single electroactive polymer. FIG. 1C illustrates a monolithic transducer 25 comprising a plurality of active areas in accordance with one embodiment of the present invention. The monolithic transducer 25 converts between electrical energy and mechanical energy. The monolithic transducer 25 comprises an electroactive polymer 26 including two active areas 27a and 27b. The polymer 26 can be held using, for example, a rigid frame (not shown) attached at the edges of polymer 26.

Active area 27a has top and bottom electrodes 28a and 28b attached to top and bottom surfaces 26c and 26d of polymer 26, respectively. The electrodes 28a and 28b provide and/or receive a voltage difference across a portion 26a of the polymer 26. For actuation, portion 26a deflects with a change in electric field provided by the electrodes 28a and 28b and comprises the polymer 26 between the electrodes 28a and 28b and any other portions of the polymer 26 having sufficient electrostatic force to enable deflection upon application of voltages using the electrodes 28a and 28b.

Active area 27b comprises top and bottom electrodes 29a and 29b attached to the polymer 26 on its top and bottom surfaces 26c and 26d, respectively. The electrodes 29a and 29b provide and/or receive a voltage difference across a portion 26b of the polymer 26. One advantage of monolithic transducer 25 is that active areas 27a and 27b may be used independently. For example, active area 27a may be used for stiffness control while active area 27b is used for sensing deflection of polymer 26, or a mechanical interface attached to one end. Alternately, active area 27a may be used for closed loop stiffness control while active area 27b is used for closed loop damping control. Active areas for monolithic polymers and transducers of the present invention may be flexibly arranged. Further description of monolithic transducers suitable for use with the present invention are further described in commonly owned U.S. patent application Ser. No. 09/779,203, which is incorporated by reference herein for all purposes.

For a transducer having a substantially constant thickness, one mechanism for differentiating the performance of the transducer, or a portion of the transducer associated with a single active area, as performing in actuator or generator mode, is in the change in net area orthogonal to the thickness associated with the polymer deflection. For these transducers, or active areas, when the deflection causes the net area of the transducer/active area to decrease and there is charge on the electrodes, the transducer/active area is converting from mechanical to electrical energy and acting as a generator. Conversely, when the deflection causes the net area of the transducer/active area to increase and charge is on the electrodes, the transducer/active area is converting electrical to mechanical energy and acting as an actuator. The change in area in both cases corresponds to a reverse change in film thickness, i.e. the thickness contracts when the planar area expands, and the thickness expands when the planar area contracts. Both the change in area and change in thickness determine the amount of energy that is converted between electrical and mechanical. Since the effects due to a change in area and corresponding change in thickness are complementary, only the change in area is discussed herein for sake of brevity. In addition, although deflection of an electroactive polymer is primarily discussed herein as a net increase in area of the polymer when the polymer is being used in an actuator to produce mechanical energy, it is understood that in some cases (i.e. depending on the loading), the net area may decrease to produce mechanical work. As will be described below, electroactive polymers also provide a sensor mode. Thus, transducers of the present invention may include actuator, generator, and/or sensor modes, in addition to providing variable stiffness and/or damping, depending on how the polymer is configured and applied.

3. Variable Stiffness

Polymer 12 has a stiffness, or modulus, or spring constant, associated with its deflection. As the term is used herein, stiffness refers to the ratio between the force required to deflect a polymer and the deflection of the polymer. In other words, the deflection of a polymer multiplied by the stiffness yields the force required to produce that deflection. The present invention provides techniques to implement polymers and devices with a desired stiffness, and in some embodiments, allows the stiffness of an electroactive polymer transducer or associated device to be variably controlled. The desired stiffness is typically determined based on design considerations of an application. Exemplary design inputs include: a desired stiffness to avoid resonant frequency in a mechanical system (such as an engine piston firing frequency), a desired stiffness for a shoe that provides a range of comfort during usage, a desired stiffness for a robotic joint, or a desired damping input for a vibrating system. The design inputs may include factors such as time, forces encountered by a transducer or a device that the transducer is implemented in, environment, user preferences, etc.

As briefly described above, an electroactive polymer transducer includes a relationship between electrical energy and mechanical energy in the polymer and any mechanical loading on the polymer. By adjusting the electrical state provided to the electroactive polymer, mechanical properties such as the stiffness of an electroactive polymer transducer may be varied and controlled. Thus, a system for providing variable stiffness in accordance with the present invention typically comprises control electronics in electrical communication with electrodes included in the transducer. The control electronics are designed or configured to set or change an electrical state or electrical impedance that results in the desired stiffness for the device. The electrical state or electrical impedance, examples of which will be provided below, typically relates to temporal electrical conditions applied by the control electronics to the transducer, via the electrodes, to obtain the desired force per unit length deflection, or the desired damping, of the polymer—or an associated mechanical interface.

Often, the transducer will be implemented in a device comprising a mechanical interface that provides a mechanical transition between polymer deflection and displacement or motion in the physical system that the device is implemented in. Thus, the mechanical interface is responsible for translating or at least partially transferring forces and mechanical energy from the system that the device is implemented in onto the transducer. For example, the mechanical interface may correspond to a rigid member of a linear actuator comprising the polymer (see FIG. 5A for example). Here, the rigid member translates forces and energy between the polymer and a load coupled to the rigid member; and the present invention provides a desired stiffness for displacement of the rigid member. In another example, the mechanical interface is a portion of a shoe covering a person's foot that is mechanically coupled to one or more transducers. In this case, the transducers are configured to provide a desired stiffness for motion of the person's foot in the shoe with respect to the ground.

4. Damping

Depending on the electronics in electrical communication with the transducer, damping may also be provided by an electroactive polymer transducer. In this case, electrical energy produced by a transducer may be exhausted by dissipative electronics in electrical communication with the electrodes. The dissipative electronics are designed or configured to dump electrical energy in response to a change in the electrical state provided to the transducer, such as that caused by deflection of the polymer or displacement of the mechanical interface. The term "dump" in this case refers to the removal of electrical energy from the system such that it is no longer immediately available to do mechanical work for the polymer, device or mechanical interface. For example, the dissipative electronics may comprise a resistor that exhausts electrical energy that resulted from deflection of the polymer from a position as shown in FIG. 1B to that shown in FIG. 1A. In this case, the energy reduction may be achieved by having the charge (current) flow through a resistor. Alternatively, the dissipative electronics may comprise a battery that stores the electrical charge raised to a higher potential by the transducer as a result of external mechanical deflection. Thus, the "dumped" electrical energy may be dissipated as heat (for example in a resistor), or it can be stored using well known techniques (for example, in a battery or capacitor) and potentially used later. In some case, the stored electrical energy may be used to provide power for stiffness control. The mechanical to electrical energy conversion may be either direct, in which the mechanical work contracts the polymer as electrical energy is dumped during the contraction, or indirect, in which the mechanical work expands the polymer and electrical energy is dumped during elastic return of the polymer. Although the present invention will now primarily be described in detail with respect to stiffness based systems and control thereof, it should be understood that many of the systems described below may also be implemented as a damping system, or a combined damping and stiffness system.

5. Open Loop Control

In one aspect, the present invention relates to systems that provide stiffness and/or damping that is controlled using open loop techniques. As the terms used herein, open loop refers to systems designed or configured such that a desired stiffness and/or damping is input directly into the control elements unaffected by the output performance of the system. Thus, the time continuous performance of the system is independent of direct feedback from the output desired stiffness and/or damping. To damp vibrations then, the system does not require a sensor to detect the vibration. In a specific embodiment, the resonant frequency of a mechanical system is influenced by the stiffness provided by an electroactive polymer transducer controlled by an open loop electrical circuit.

Figure 2A:
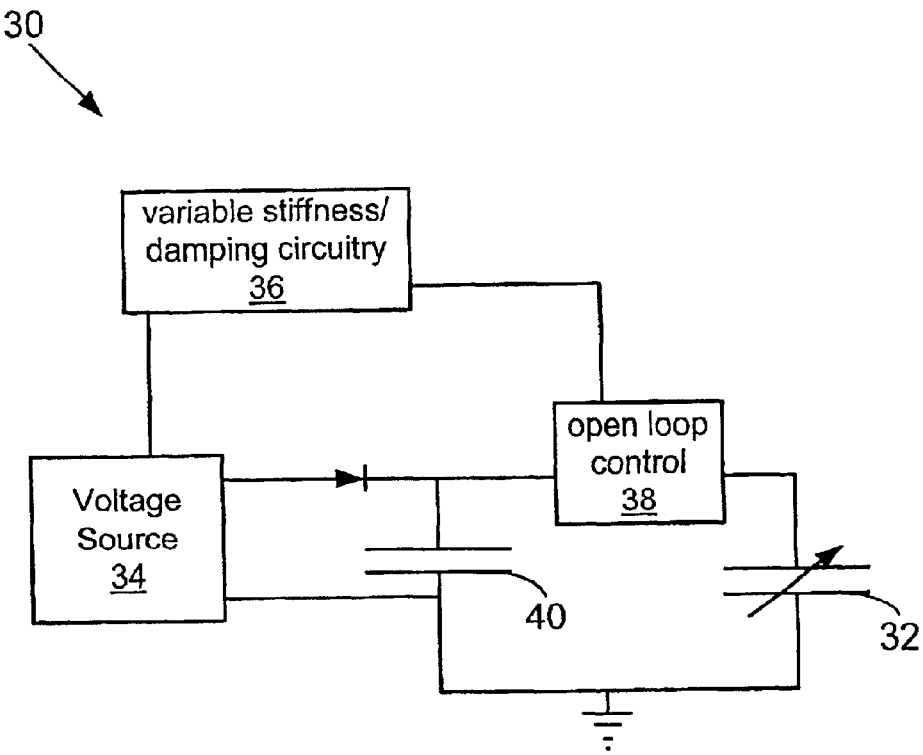
FIG. 2A illustrates an electrical schematic of an open loop variable stiffness/damping system in accordance with one embodiment of the present invention.

FIG. 2A illustrates an electrical schematic of an open loop variable stiffness/damping system 30 in accordance with one embodiment of the present invention. While system 30 will now be described as an apparatus composed of units, those skilled in the area will recognize that the present invention encompasses a method, process or control software having as steps the actions performed by each unit and described below. System 30 comprises an electroactive polymer transducer 32, voltage source 34, control electronics comprising variable stiffness/damping circuitry 36 and open loop control 38, and buffer capacitor 40.

Voltage source 34 provides the voltage used in system 30. In this case, voltage source 34 sets the minimum voltage for transducer 32. Adjusting this minimum voltage, together with open loop control 38, adjusts the stiffness provided by transducer 32. Voltage source 34 also supplies charge to system 30. In one embodiment, voltage source 34 may apply a voltage greater than 200 Volts, or thousand of volts, although the applied voltage is not limited to these ranges. In some applications, it may be undesirable to use a high-voltage source to directly supply the voltage. In this case, voltage source 34 may include a commercially available voltage supply, such as a low-voltage battery that supplies a voltage in the range of about 1–15 Volts, and step-up circuitry that raises the voltage of the battery. In this case, voltage step-down performed by step-down circuitry in electrical communication with the electrodes of transducer 32 may be used to adjust an electrical output voltage from transducer 32. Alternately, voltage source 34 may include a variable step-up circuit that can produce a variable high voltage output from the battery. As will be described in further detail below, voltage source 34 may be used to apply a threshold electric field as described below to operate the polymer in a particular stiffness regime.

The desired stiffness or damping for system 30 is controlled by variable stiffness/damping circuitry 36, which sets and changes an electrical state provided by control electronics in system 30 to provide the desired stiffness/damping applied by transducer 32. In this case, stiffness/damping circuitry 36 inputs a desired voltage to voltage source 34 and/or inputs a parameter to open loop control 38. Alternately, if step-up circuitry is used to raise the voltage source 34, circuitry 36 may input a signal to the step-up circuitry to permit voltage control.

As transducer 32 deflects, its changing voltage causes charge to move between transducer 32 and buffer capacitor 40. Thus, externally induced expansion and contraction of transducer 32, e.g., from a vibrating mechanical interface, causes charge to flow back and forth between transducer 32 and buffer capacitor 40 through open loop control 38. The rate and amount of charge moved to or from transducer 32 depends on the properties of buffer capacitor 40, the voltage applied to transducer 32, any additional electrical components in the electrical circuit (such as a resistor used as open loop control 38), the mechanical configuration of transducer 32, and the forces applied to or by transducer 32. In one embodiment, buffer capacitor 40 has a voltage substantially equal to that of transducer 32 for zero displacement of transducer 32, the voltage of system 30 is set by voltage source 34, and open loop control 38 is a wire; resulting in substantially free flow of charge between transducer 32 and buffer capacitor 40 for deflection of transducer 32.

Open loop control 38 provides a passive (no external energy supplied) dynamic response for stiffness applied by transducer 32. Namely, the stiffness provided by transducer 32 may be set by the electrical components included in system 30, such as the control electronics and voltage source 34, or by a signal from control circuitry 36 acting upon one of the electrical components. Either way, the response of transducer 32 is passive to the external mechanical deflections imposed on it. In one embodiment, open loop control 38 is a resistor. One can also set the resistance of the resistor to provide an RC time constant relative to a time of interest, e.g., a period of oscillation in the mechanical system that the transducer is implemented in. In one embodiment, the resistor has a high resistance such that the RC time constant of open loop control 38 and transducer 32 connected in series is long compared to a frequency of interest. In this case, the transducer 32 has a substantially constant charge during the time of interest. A resistance that produces an RC time constant for the resistor and the transducer in the range of about 5 to about 30 times the period of a frequency of interest may be suitable in this case. An RC time constant in the range of about 2 to about 100 times the frequency of interest is suitable for some applications. An RC time constant in the range of about 10 to about 20 times the frequency of interest may be suitable for other applications. For applications including cyclic motion, increasing the RC time constant much greater than the mechanical periods of interest allows the amount of charge on electrodes of transducer 32 to remain substantially constant during one cycle. In cases where the transducer is used for damping, a resistance that produces an RC time constant for the resistor and the transducer in the range of about 0.1 to about 4 times the period of a frequency of interest may be suitable. As one of skill in the art will appreciate, resistances used for the resistor may vary based on application, particularly with respect to the frequency of interest and the size (and therefore capacitance C) of the transducer 32.

In one embodiment of a suitable electrical state used to control stiffness and/or damping using open loop techniques, the control electronics apply a substantially constant charge to electrodes of transducer 32, aside from any electrical imperfections or circuit details that minimally affect current flow. The substantially constant charge results in an increased stiffness for the polymer that resists deflection of transducer 32. One electrical configuration suitable for achieving substantially constant charge is one that has a high RC time constant, as described. When the value of the RC time constant of open loop control 38 and transducer 32 is long compared to the frequency of interest, the charge on the electrodes for transducer 32 is substantially constant. Without wishing to be constrained by any particular theory, a number of theoretical relationships regarding the stiffness performance of transducer 32 will now be described. These relationships are not meant in any manner to limit the manner in which the described electroactive polymer transducers are operated.

In a specific embodiment for generalized displacement of an electroactive polymer transducer, the stiffness may be approximated by:

$$K = b + 3(Q^2/Co)L^2/(L+x)^4 \qquad (1)$$

where K is the stiffness, b is a generalized spring constant for the polymer (for example, force per unit deflection of the polymer), Q is the charge on the electrodes for the transducer, Co is the capacitance at zero (x=0) deflection, L is the length before any stretching (and including any prestrain) and x measures displacement from this initial length, L. While equation (1) provides one exemplary relationship between electrical and mechanical performance of transducer 32, it is understood that the exact relationship will depend on the specific geometry and loading on transducer 32, which may be calculated based on the geometry and/or determined from experiment.

Based on equation (1), the stiffness of transducer 32 may be set by the amount of charge, Q, supplied to the transducer. For system 30, the value of Q is determined by the input voltage from voltage source 34. $Q=C_{av}V$ may be used as a simple approximation for transducer 32, where $C_{av}$ is the average value (for example, averaged over a mechanical cycle) of transducer 32 capacitance. Using a substantially constant charge based open loop control for transducer 32 may then be advantageous when the desired stiffness of transducer 32 is greater than the polymer stiffness.

When a resistor is used for open loop circuit 38 as described above, increasing the resistance of the resistor too much may slow the stiffness response of transducer 32 by slowing the amount of current passed the resistor and the time to reach the full charge, Q, of transducer 32. In some cases, a transistor, triac, relay, or other switching device in open loop control 38 may be used to charge transducer 32 quickly. In one embodiment, the resistor is a variable resistor and its resistance value may be manually set using, for example, a potentiometer. Alternately, the variable resistor may be set and adjusted by a signal from circuitry 36 to provide a variable stiffness for system 30. In general, increasing the resistance of a resistor used for open loop control 38 increases the stiffness of transducer 32 since charge on transducer 32 will move slower across open loop control 38.

It should be noted that in many cases, one is setting the damping, as well as the stiffness, performance of system 30 when the resistance of the resistor in open loop control 38 is selected. Expansion and contraction of transducer 32 causes charge to flow back and forth between transducer 32 and buffer capacitor 40. With a resistor between transducer 32 and capacitor 40, the flow of charge exhausts electrical energy by resistance losses. Thus, the resistance of a resistor used in open loop control 38 may be selected to provide a particular damping performance, such as high losses associated with a highly damped system. This damping control is in addition to the control provided by setting the resistance of the resistor to provide a specific stiffness or temporal response for system 30, such as an RC time constant relative to a time of interest as described above. In some cases, damping effects may diminish from using a high resistance resistor since less current flows through the resistor. As one of skill in the art will appreciate, system 30 may be specifically configured according to an application to provide a wide range of resistance losses, damping performance, and temporal responses. In a specific embodiment, open loop control 38 comprises a variable resistor. In this case, damping and stiffness performance provided by system 30 may be independently set or changed. For example, the variable resistor is used to set the desired damping for the system, while buffer capacitor 40 and voltage source 34 may be set to provide a desired stiffness. In general, damping effects are appreciable when the RC time constant is comparable to the periods of mechanical times of interest. If RC is much greater than the mechanical periods, little charge flows through open loop control 38 so the damping is minimal. Alternately, if RC is much less than the mechanical periods, then little voltage is developed across open loop control 38 so energy dissipation, and hence damping, is again minimal. In some case, it should be noted that one is simultaneously setting both stiffness and damping, or the mechanical impedance of the system, as mentioned before.

In another embodiment of a suitable electrical state or electrical impedance used to control stiffness and/or damping with open loop techniques, the control electronics and voltage source 34 apply a substantially constant voltage to electrodes of transducer 32. More specifically, adjusting the minimum constant voltage supplied by voltage source 34 varies the stiffness/damping provided by transducer 32. Generally, increasing the minimum constant voltage supplied by voltage source 34 decreases the stiffness of transducer 32. For a transducer 32 comprising a simple strip of electroactive polymer implemented in system 30 with a substantially constant voltage, the stiffness of may be simply approximated by:

$$K=b-V^2Co/L^2 \qquad (2)$$

where Co is the transducer capacitance at x=0, and V is the voltage on transducer 32.

Based on equation (2), the stiffness of transducer 32 may be controlled by varying the voltage, V, as provided by voltage source 34. In contrast to equation (1) for constant charge, the stiffness is reduced in the constant voltage case according to equation (2). Using the constant voltage based open loop control for transducer 32 may then be advantageous for cases where desired stiffness of transducer 32 is less than the polymer stiffness.

There are a variety of ways to maintain a substantially constant voltage on transducer 32 within system 30. In a specific embodiment, buffer capacitor 40 has a much larger capacitance than that of transducer 32 and open loop control 38 is a wire, e.g., a short-circuit between the buffer capacitor 40 and transducer 32. A capacitance for buffer capacitor 40 in the range of about 5 times to about 30 times that of the capacitance transducer 32 may be suitable for some applications.

Figure 2B:
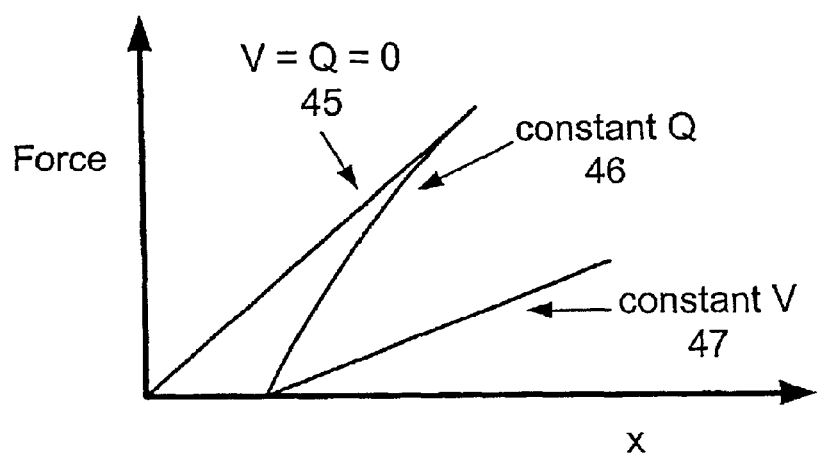
FIG. 2B illustrates exemplary relationships between force and deflection for the transducer included in the system of FIG. 2A, according to constant charge and constant voltage states applied to electrodes included in the transducer in accordance with specific techniques of the present invention.

FIG. 2B illustrates exemplary relationships 45, 46 and 47 between force and deflection for transducer 32 according to the above described open loop constant charge and constant voltage cases. As shown in FIG. 2B, it is assumed that the constant Q and constant V cases have charge and voltage chosen such that they both have the same zero force displacement. The stiffness, K, is the slope of each force-displacement relationship shown in FIG. 2B. The no charge stiffness 45 refers to the generalized spring constant or intrinsic stiffness of the polymer, b. In this case, the constant charge stiffness 46 asymptotically approaches the no charge stiffness 45, whereas the constant voltage stiffness 47 has a constant slope that is different and lower than that no charge stiffness 45.

As one of skill in the art will appreciate, there are other possible electrical circuit configurations for providing open loop stiffness and/or damping control using an electroactive polymer transducer, and the present invention is not limited to system 30, or the exemplary relationships described in FIG. 2B.

In another embodiment, open loop control is achieved by connecting the open loop control 38 of FIG. 2A in parallel with transducer 32 rather than in series as shown in FIG. 2A. One can also vary the stiffness of an electroactive polymer transducer and implement constant charge control by eliminating the buffer capacitor and resistor described above and by disposing a diode downstream from voltage source 34. In this case, the diode prevents current back flow into voltage source 34. These latter two embodiments implement constant charge control without dumping losses in the resistor, and can change the stiffness of the transducer relatively quickly. In general, stiffness variation using an electroactive polymer transducer depends on the electrical impedance seen by the transducer.

The variable stiffness/damping circuitry 36 may also include a logic device, such as single chip computer or microcontroller, to perform charge and voltage control functions on transducer 32. In this case, the logic device sets the voltage provided by voltage source 34, or sets a parameter of another electrical component of the control electronics, such as the resistance of a variable resistor provided in open loop control 38.

6. Closed Loop Control

In one aspect, closed loop control techniques are implemented in systems of the present invention to deliver variable and controlled stiffness and/or damping performance. In this case, a system employs feedback information to control the transducer and its associated circuitry, and comprises additional hardware to obtain the feedback information, as well as circuitry to make decisions on the information. For example, a sensor may be employed to detect a parameter related to the desired control output (stiffness, damping, motion, speed, force, phase difference between input and output, etc.) and provide feedback to the control electronics. The feedback information may also be provided to a logic device configured to make decisions based on the information and configured to output control signals to control electronics affecting an electroactive polymer transducer.

In one exemplary closed loop control application, a transducer is operated out of phase from the forces and deflections associated with a vibration. To resist vibrations, the polymer is actuated when one wants the transducer to expand out of phase from the vibration, and electrical energy is absorbed in generator mode when one wants the polymer to contract out of phase from the vibration. In other words, the polymer may be actuated (charge is added to the polymer) to provide a resistive force that opposes contraction of the polymer, and the polymer may be operated in generator mode (charge is removed from the polymer) to provide a resistive force that opposes expansion of the polymer. Similar to the open loop scenario, a resistor may be placed in the control electronics in electrical communication with electroactive polymer transducer to dump energy generated from the vibrations and provide closed loop damping. In either case, a logic device in electrical communication with the voltage source, variable resistor, or other electrical components, may be used to actively change the electrical state applied to the transducer, and thus actively change the stiffness and/or damping provided by the system.

Figure 3A:
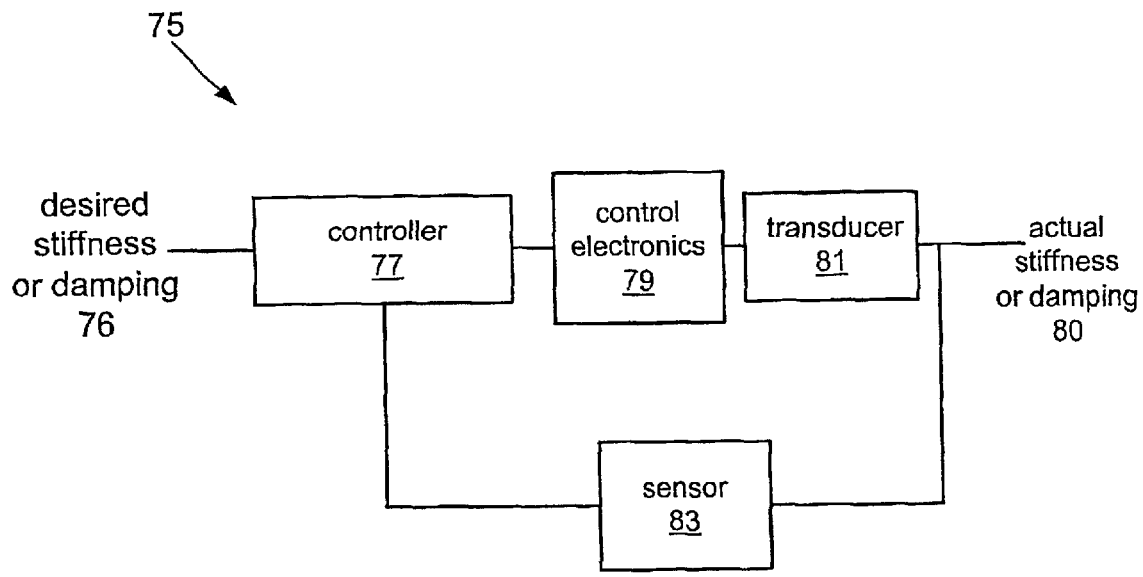
FIG. 3A illustrates a high level schematic of a closed loop stiffness and damping system in accordance with one embodiment of the present invention.

FIG. 3A illustrates a high level schematic of a closed loop stiffness and damping system 75 in accordance with one embodiment of the present invention. System 75 comprises a closed loop controller 77, electrical circuitry 79, transducer 81, and sensor(s) 83.

System 75 uses one or more sensors 83 to detect a parameter related to the desired stiffness. The system may also include circuitry associated with sensor 83 to transfer and process feedback information produced by the sensor. For example, the circuitry may transfer the feedback to a processor implementing control over the control electronics. The parameter may correspond to any information useful for controlling the transducer in an application, such as deflection or velocity of a portion of the polymer; displacement, velocity or acceleration of a mechanical interface; or displacement, velocity or acceleration of a vibrating source or external mechanical load.

The sensor chosen for a particular application should be able to detect the physical parameter under consideration. For example, a simple potentiometer that converts deflection into a voltage may be suitable in many applications. The sensor may employ a transduction mechanism to convert the sensed parameter or into an electrical signal. Suitable transduction examples include conductometric (changes in resistance or conductivity), potentiometric, capacitive, amperometric, optical, resonant, fluorescent, piezo-electric, optoelectric, magnetoresistive, etc.

In one embodiment, an electroactive polymer transducer is used in sensor mode to provide the feedback information. That is, both the transducer 81 which executes the stiffness control and the feedback sensor 83 are both electroactive polymers. In fact, they may be the same physical transducer, as will be discussed below. FIGS. 1B and 1A may be used to illustrate one manner in which an electroactive polymer provides sensor functionality. The change in the electrode area as well as spacing between the electrodes changes the capacitance of transducer 10. If the polymer 12 contracts, becoming thicker and forcing the electrodes 14 and 16 to contract, the capacitance of transducer 10 decreases according to well-known formulas for calculating capacitance based on electrode area, electrode separation, and the dielectric constant of the polymer 12. The change in capacitance can be measured electrically using well-known techniques, such as a capacitance bridge, thereby measuring mechanical deflection of the transducer. In addition to detecting capacitance changes, an electroactive polymer transducer operating in sensor mode may also detect changes in resistance and impedance of the transducer or its constituent elements. Further description of electroactive polymer sensor functionality is described in commonly owned patent application entitled 'Electroactive Polymer Sensors', patent application Ser. No. 10/007/705. This document is incorporated by reference herein for all purposes.

In a specific embodiment, a single electroactive polymer transducer is configured such that it provides both stiffness/damping control and sensor functionality. This may be achieved, for example, using a monolithic polymer that implements one active area for stiffness/damping and another active area for sensing. Alternately, multifunctionality may be achieved by applying signals having different frequencies for each function onto a single active area. More specifically, a small amplitude high frequency signal (sensing) may be superimposed on the driving (actuation/generation) signal, e.g, a 1000 Hz sensing signal may be superimposed on a 10 Hz actuation/generation signal. Sensing electronics may then detect and measure the high frequency response of the polymer to allow sensor functionality that does not interfere with polymer actuation/generation and stiffness/damping control. Similarly, if impedance changes are detected and measured while the electroactive polymer transducer is being used as in actuator or generator mode, a small high-frequency AC signal may be superimposed on the lower-frequency actuation/generation voltage signal. Filtering techniques, well-known in the literature, may then separate the measurement and power signals.

Feedback from sensor 83 is provided to controller 77, which regulates the stiffness of transducer 81 via control electronics 79. In one embodiment, controller 77 is a conventional logic device, such as a computer or microcontroller, which is in electrical communication with control electronics 79 and outputs control signals that regulate one or more electrical elements within control electronics 79. Control electronics 79 sets or changes an electrical state to transducer 81 that results in the desired stiffness or damping 76 for system 75. For example, controller 77 may include a logic device that provides control signals that cause a voltage source to adaptively vary charge or voltage supplied to transducer 81, thereby actively controlling stiffness. In another embodiment, controller 77 implements analog or hybrid digital/analog circuitry that outputs control signal to regulates one or more electrical elements within control electronics 79.

The system 75 of FIG. 3A may be used to control stiffness and/or damping. In another embodiment of closed loop control, input 76 may correspond to 0 deflection, where deflection is a vibration. Input 76 may also correspond to 0 velocity or 0 force. The output 80 that is actually sensed is the corresponding deflection, velocity or force. The desired damping and stiffness (more generally the system impedance) is then defined by controller 77. In other words, it is a control system that drives a vibration to zero. This approach is well-known in the literature and is part of basic control system design. For example, a PID (proportional-integral-differential) controller is typically used for controller 77 to make a mechanical system have the desired impedance. When viewed in this manner, the electroactive polymer transducer is basically operating as an actuator, perhaps combined with a sensor. The actuator is typically attached to the object whose vibratory motion is being suppressed (usually a mass like a robot link or automobile body). The ability to "control" the stiffness and damping really means that the values of the control parameters may be set, e.g. set the PID coefficients, in controller 77.

Although input 76 and output 80 of FIG. 3A are illustrated as a desired and actual stiffness or damping, it is understood that each may correspond to a desired and actual force, acceleration or velocity, as determined by a specific control circuit and application. For example, the input 76 and output 80 may correspond to a desired deflection, force, acceleration or velocity (typically zero) and actual force, acceleration, deflection or velocity, respectively, in a dynamic damping system.

Figure 3B:
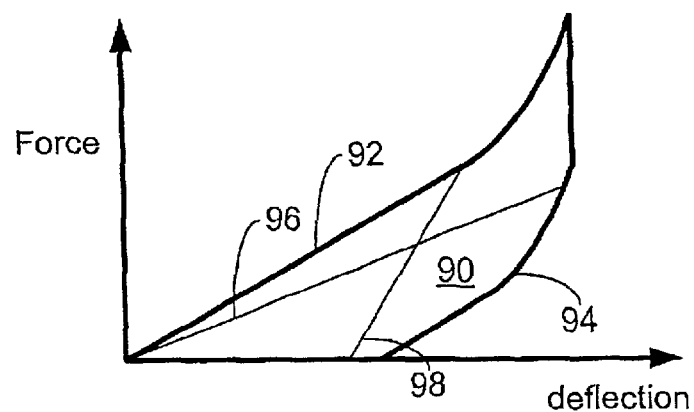
FIG. 3B illustrates a stiffness range for a transducer resulting from varying voltages actively provided by control electronics in accordance with one embodiment of the present invention.

FIG. 3B illustrates exemplary stiffness variations that may be achieved with active control. Force-deflection line 92 shows the applied force-deflection properties of the transducer 81 with zero charge and zero voltage (only positive deflections and positive forces are shown for simplicity). If voltage is applied to the transducer, the applied force needed to deflect the transducer may be larger or smaller depending on the specific transducer geometry and design, but for illustration purposes it is assumed that the applied force for a given deflection decreases upon application of a voltage, so that with the maximum allowed voltage the force-deflection curve might look like curve 94. It is understood that the deflection for a given voltage may vary based on the mechanical loading. Controller 77, in conjunction with control electronics 79 and sensor 83, can control to any force-deflection curve that lies within region 90 between zero voltage force-deflection curve 92 and maximum voltage force-deflection curve 94. For example, if sensor 83 measures deflection, and controller 77 can set the voltage on transducer 81 through control electronics 79, then the system 75 can be controlled to achieve a lower stiffness curve 96. Alternately, it might be controlled to achieve a higher stiffness force-deflection curve such as force-deflection curve 98. Much more complex mechanical response can be controlled as desired including non-linear stiffnesses or even negative stiffnesses with appropriately external loads to ensure system stability. Complex stiffnesses can be achieved, for example, if controller 77 includes a digital computer with a look-up table in memory to apply the correct voltage to transducer 81 for a given deflection to cause transducer 81 to apply the desired force at that deflection. The correct voltage can be stored (as a digital number later converted to an output voltage by controller 77 and control electronics 79) by measuring the force-deflection properties of the transducer 81 for various voltages. Other techniques for controlling stiffness with actuators that can produce forces are known in the art.

Referring back to FIG. 3A, active damping may also be achieved using velocity or strain rate sensors for sensor 83. The polymer transducer 81 will have an intrinsic, zero voltage damping. Damping may be increased if the system 75 applies a force in the negative deflection direction when the deflection is increasing, and a force in the positive deflection direction when the deflection is decreasing. The force can be controlled (within the limits of the performance of transducer 81 as an actuator) by varying the applied voltage to the transducer 81, and the force can be made proportional to the strain or deflection rate as measured by sensor 83. Damping may even be decrease relative the intrinsic damping of the polymer by suitable application of force (for example, the force can be controlled to offset the intrinsic damping forces from transducer 81).

In some cases, sensor 83 monitors, and controller 77 regulates, an alternate parameter other than stiffness or damping, such as the force or velocity of a mechanical interface affected by system 75 changes in stiffness and/or damping. Using sensor 83, detected parameter information may be used to adjust the electrical state provided by control electronics 79, and corresponding setting or change in the stiffness or damping of transducer 81, to accordingly affect the alternate parameter. For example, the alternate parameter may represent the center of mass, or another controlled portion, of a robot. In this case, the stiffness of transducer 81 as operably associated with a moving portion configured within the robot (e.g., a joint for a robotic leg) may be used to actively control the alternate parameter. For the robot, the alternate parameter may include active control of the position, velocity or acceleration of the center of mass of the robot, or a portion of the robot affected by transducer 81 stiffness changes (e.g., the position, velocity or acceleration of the leg or an arm).

Control electronics receive control signals from controller 77 and convert them to an electrical state or impedance that sets or changes the electrical state of transducer 81, in order to cause a corresponding setting or change in the stiffness of the device or system. Exemplary elements that may be controlled as a part of control electronics 79 to provide a suitable electrical state include: a voltage source that provides a voltage to transducer 81 (either directly or indirectly through a voltage step up circuit), step up circuitry disposed between transducer 81 and a voltage source, a voltage source that provides charge to transducer 81, a resistor or diode that controls the amount and rate of charge transmitted to and/or from transducer 81, other forms of charge control performed by charge control circuitry that is used to add or to remove charge from the transducer 81 as dictated by control signals from controller 77 (e.g., a transistor, triac, relay, or other switching device), a capacitor that supplies and/or receives charge from transducer 81 with a characteristic capacitor voltage-charge profile, an inductor that allows charge to flow but converts electrical-to-magnetic energy and magnetic-to-electrical energy according to the well known behavior of inductors, a transformer that is similar to an inductor in that it has inductance but also has a secondary coil winding that can be used to monitor changes in charge flow (for feedback purposes) or for removing electrical energy from the system without dissipating it as heat, combinations of these components, etc. Some of these types of control electronics would affect more than just the stiffness or damping of the transducer 81 but can also be used to affect other properties of the transducer 81 such as hysteresis and other non-linear mechanical properties.

The closed loop control techniques may also be applied to provide time continuous controlled damping. In this case, dissipative electronics are used to dump electrical energy in response to changes in the electrical state provided to transducer 81, e.g., changes in the electrical state resulting from deflection of transducer 81 or an associated mechanical interface. Any of the techniques described above with respect to open loop damping control may be used in this manner, with the addition of time continuous feedback and control that dynamically alters the electrical state provided by the control electronics. It should be noted that damping control may be achieved by actively controlling control electronics responsible for energy dissipation (e.g. controlling the resistance of a variable resistor) or actively controlling control electronics responsible for stiffness. Since changing the stiffness of the transducer or device will affect mechanical performance and the amount of motion thereof, changing the stiffness will also vary the closed loop damping performance. Any of the techniques described above with respect to open loop stiffness control may be actively controlled in this manner to dynamically control damping. Thus, by actively controlling the stiffness of transducer 81 and affecting the mechanical energy associated with polymer deflection, transducer 81 stiffness may be controlled to regulate the amount of electrical energy available for dissipative exhaust.

Controller 77 may also provide advanced control performance on a system such as an over-damped, under-damped or critically damped system by controlling control electronics 79. For example, controller 77 may regulate the stiffness and/or damping performance of system 75 to provide an over-damped control response for a mechanical system including vibrations that transducer 81 is configured to minimize. As mentioned above, the present invention advantageously permits independent control of damping and stiffness with a single transducer (based on the control electronics), thus increasing the flexibility of systems that are configured to provide a particular dynamic responses. For example, controller 77 may be configured independently control damping via a variable resistor and control stiffness via the charge or voltage provided to transducer 81.

7. Shape Change Based Variable Stiffness

In addition to the above described open loop and closed loop techniques for providing variable stiffness, stiffness may also be varied and controlled in systems of the present invention based on the changing shape of an electroactive polymer transducer or its associated mechanical device. In this case, the electroactive polymer transducer is configured such that deflection of the polymer, either by actuation or external deformation, to a desired shape results in a structural change that provides a desired stiffness.

Figure 4A:
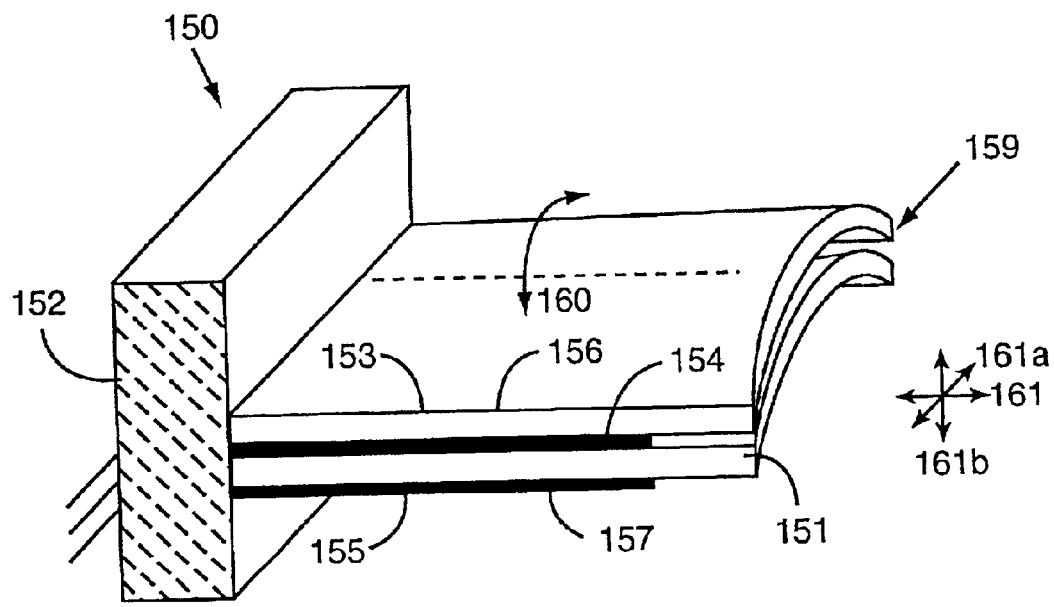
FIG. 4A illustrates a bending transducer for providing variable stiffness based on structural changes related to polymer deflection in accordance with one embodiment of the present invention.

FIG. 4A illustrates a bending transducer 150 for providing variable stiffness based on structural changes in accordance with one embodiment of the present invention. In this case, transducer 150 varies and controls stiffness in one direction using polymer deflection in another direction. Transducer 150 includes a polymer 151 fixed at one end by a rigid support 152. Attached to polymer 151 is a flexible thin material 153 such as polyimide or mylar using an adhesive layer, for example. The flexible thin material 153 has a modulus of elasticity greater than polymer 151. The difference in modulus of elasticity for the top and bottom sides 156 and 157 of transducer 150 causes the transducer to bend upon actuation. Electrodes 154 and 155 are attached to the opposite sides of the polymer 151 to provide electrical communication between polymer 151 and control electronics used to control transducer 150 deflection. Transducer 150 is not planar but rather has a slight curvature about axis 160 as shown. Direction 160 is defined as rotation or bending about a line extending axially from rigid support 152 through polymer 151. This curvature makes transducer 150 stiff in response to forces applied to the tip along any of the directions indicated by the arrows 161. In place of, or in addiction to forces, torques may be applied to the transducer. These torques may be applied about the axis indicated by the arrows of directions 161a and 161b.

Figure 4B:
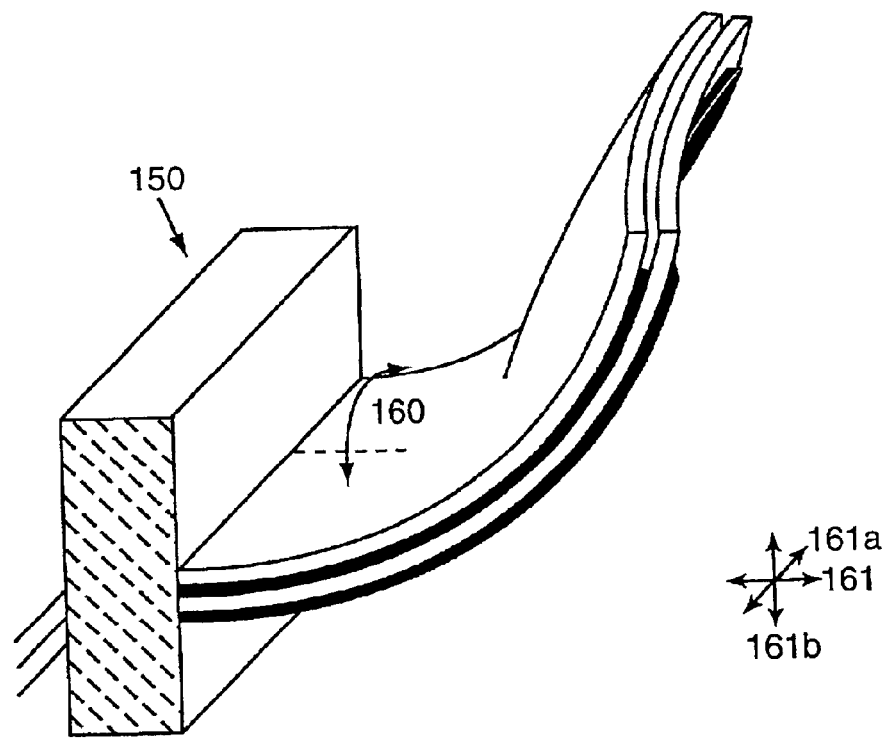
FIG. 4B illustrates the transducer of FIG. 4A with a 90 degree bending angle.

FIG. 4B illustrates transducer 150 with a deflection in direction 161b that is caused by the application of a voltage to he electrodes 154 and 155. The voltage is applied to allow the bending forces to overcome the resistance presented by the curvature in the unactuated state. Effectively, the transducer 152 bends with a kink caused by the initial curvature. In this state, the stiffness in response to the forces or torques indicated by directions 161 is much less.

A mechanical interface may be attached to the distal portion 159 of transducer 150. Alternately, mechanical attachment may be made to the flexible thin material 153 to allow transducer 150 implementation in a mechanical device. For example, transducer 150 is well suited for use in applications such as lightweight space structures where folding of the structure, so that it can be stowed and deployed, is useful. In this example, the stiff condition of individual transducers (which form ribs in the structure) occurs when the structure is deployed. To allow for stowing, the transducers are actuated and the ribs may be bent. In another application, the transducers form ribs in the sidewall of pneumatic tires. In this application, the change in the stiffness of the ribs can affect the stiffness of the tires and thus the resultant handling of the vehicle that uses the tires. Similarly, the device may be implemented in a shoe and the change in stiffness of the ribs can affect the stiffness of the shoe.

Transducer 150 provides one example where actuation of an electroactive polymer causes low-energy changes in configuration or shape that affects stiffness of a device. Using this technique, it is indeed possible to vary stiffness using transducer 150 at greater levels than direct mechanical or electrical energy control. In another embodiment, deflection of an electroactive polymer transducer directly contributes to the changing stiffness of a device that the transducer is configured within.

Figure 4C:
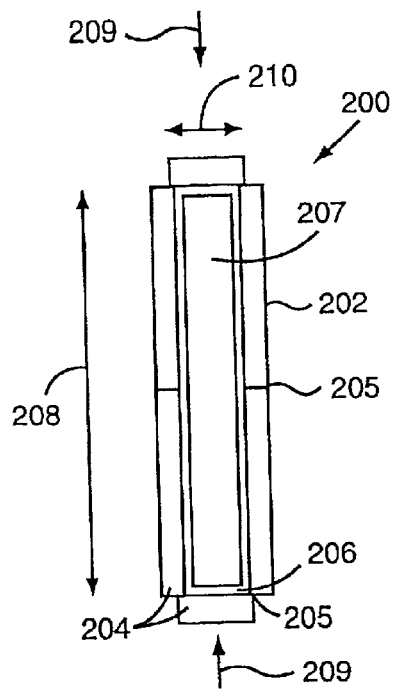
FIG. 4C illustrates a bow device suitable for providing variable stiffness in accordance with another embodiment of the present invention.
Figure 4D:
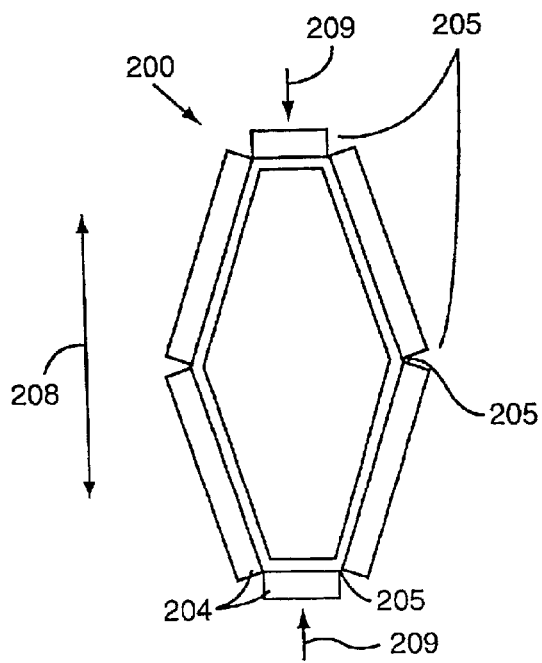
FIG. 4D illustrates the bow device of FIG. 4C after actuation.

FIG. 4C illustrates a bow device 200 suitable for providing variable stiffness in accordance with another embodiment of the present invention. Bow device 200 is a planar mechanism comprising a flexible frame 202 attached to a polymer 206. The frame 202 includes six rigid members 204 pivotally connected at joints 205. The members 204 and joints 205 couple polymer deflection in a planar direction 208 into mechanical output in a perpendicular planar direction 210. Bow device 200 is in a resting position as shown in FIG. 4C. Attached to opposite (top and bottom) surfaces of the polymer 206 are electrodes 207 (bottom electrode on bottom side of polymer 206 not shown) to provide electrical communication with polymer 206. FIG. 4D illustrates bow device 200 after actuation.

In the resting position of FIG. 4C, rigid members 204 provide a large stiffness to forces 209 in direction 208, according to their material stiffness. However, for the position of bow device 200 as shown in FIG. 4D, the stiffness in direction 208 is based on the compliance of polymer 202 and any rotational elastic resistance provided by joints 205. Thus, control electronics in electrical communication with electrodes 207 may be used to apply an electrical state that produces deflection for polymer 206 as shown in FIG. 4C, and its corresponding high stiffness, and an electrical state that produces deflection for polymer 206 as shown in FIG. 4D, and its corresponding low stiffness. In this, simple on/off control may be used to provide a large stiffness change using device 200.

In addition to stiffness variation achieved by varying the configuration of rigid members in device 200, stiffness for the position of FIG. 4D may additionally be varied using one of the open or closed loop stiffness techniques described above.

While the devices of FIGS. 4A-4D illustrate two exemplary devices where deflection of an electroactive polymer transducer causes low-energy changes in configuration or shape of the transducer that largely affects stiffness of an operably associated device, many other devices and configurations are possible.

8. Stiffness Regime Techniques

Stiffness and damping may also be varied and controlled in systems of the present invention based on the known and varied stiffness of an electroactive polymer at different levels of deflection. In this case, control electronics in electrical communication with the polymer may be configured to apply a threshold electric field to operate the polymer in a particular stiffness regime. As the term is used herein, a stiffness regime refers to the stiffness response of a polymer over a limited portion of polymer deflection. The polymer often exhibits a characteristic stiffness in a regime, such as a characteristic linear or non-linear stiffness.

Figure 4E:
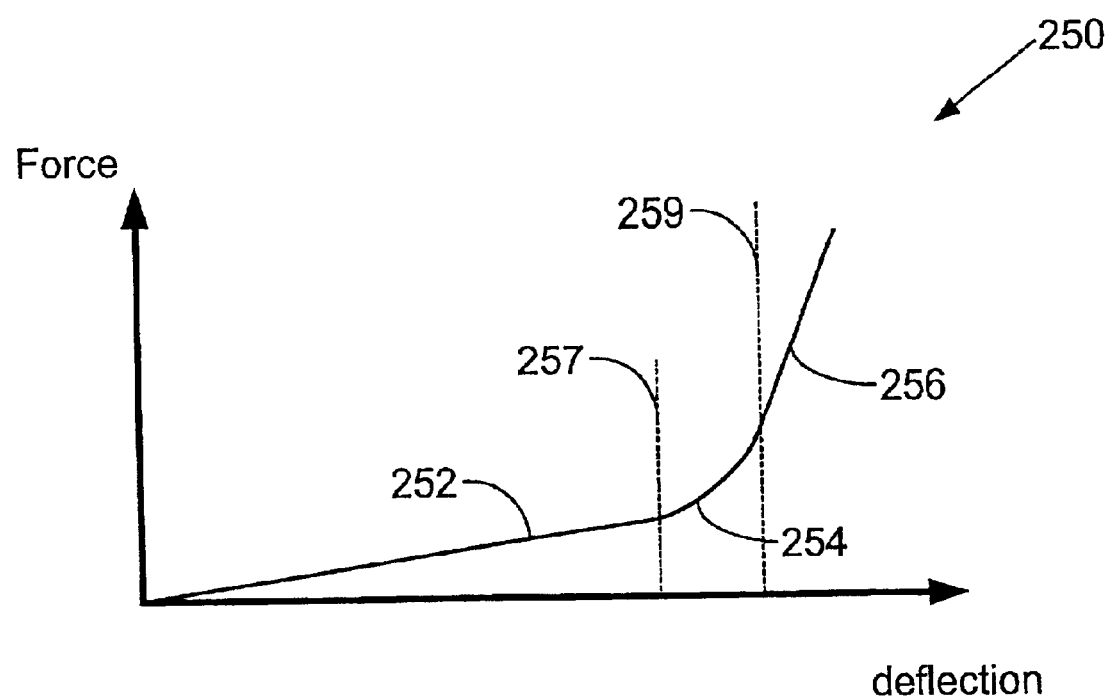
FIG. 4E shows an exemplary stiffness relationship for an electroactive polymer to facilitate illustration of stiffness regime control using an electroactive polymer transducer.

FIG. 4E shows an exemplary stiffness relationship 250 for an electroactive polymer to facilitate illustration of stiffness regime techniques using an electroactive polymer transducer. Relationship 250 illustrates three separate stiffness regimes 252, 254 and 256 for a polymer. Stiffness regime 252 corresponds to relatively low deflection and a linear stiffness response for the polymer, and is particularly well suited for applications where a relatively low stiffness and low deflection for the polymer is desirable. Regime 252 is also well suited for repeatable and accurate stiffness control over a large range of polymer deflection.

Stiffness regime 254 corresponds to a non-linear stiffness response of the polymer, and is particularly well suited for applications where dramatic changes in stiffness for the polymer are desirable. Deflection 257 corresponds to an arbitrary deflection that separates regime 254 from regime 252. A threshold electric field may be applied to actuate the polymer to achieve deflection 257. Alternately, deflection 257 may be achieved through a combination of actuation and external mechanical deflection. For example, the polymer may be externally stretched by a mechanical interface attached to the polymer in addition to electric control that provides an electric filed that actuates the polymer to reach deflection 257. Similarly, deflection 259 corresponds to an arbitrary deflection that separates regime 254 from regime 256. To operate the polymer within regime 254, a threshold electric field is applied to actuate the polymer to a deflection anywhere between deflection 257 and 259. Subsequent external mechanical deflection of the polymer, e.g., via a load attached to the polymer, will deflect the polymer and encounter the corresponding stiffness for that deflection, as determined by the current deflection of the polymer.

Stiffness regime 256 corresponds to a linear stiffness response of the polymer, and is particularly well suited for applications where linear and relatively large changes in stiffness for the polymer are desirable. To operate the polymer within regime 256, a threshold electric field may be applied to actuate the polymer to a deflection anywhere between deflection 259 and maximum deflection of the polymer. Similarly, achieving a deflection within regime 256 may also include a combination of electrical actuation and external mechanical deflection. Subsequent external mechanical deflection of the polymer will deflect the polymer and encounter the corresponding stiffness for that deflection, as determined by the current deflection of the polymer.

Control electronics in electrical communication with the polymer may provide precise actuation and deflection control of the polymer along relationship 250, and thus provide another option for stiffness control apart from those described above. The actuation and deflection control along relationship 250 may be provided using open or closed techniques. For example, closed loop control techniques may be used to sense deflection and control the polymer to provide performance according to any one of the regimes 252, 254 and 256, or all of the regimes depending on implementation.

It should be noted that stiffness regime techniques may be implemented on top of the open, e.g., constant charge or voltage, or closed loop control techniques described above. It should also be noted that one may also provide variable damping and control according to a corresponding damping-deflection relation in addition to stiffness. For example, some electroactive polymers, such as 3M's VHB 4910 acrylic polymer, have variable damping characteristics that depend on their strain or deflection (for example, higher strains generally reduce viscoelastic damping in 3M's VHB 4910). Shifting the strain state by actuating such materials thus changes the damping. This technique also works for the previous structural method.

In one embodiment, stiffness relationship 250 is determined empirically for a polymer, for example, by deflecting the polymer manually and charting the forces at various deflections. Automated determination of stiffness relationships may be done using commercially available testing machines known as dynamic mechanical analyzers or load testers that can deflect using user-proscribed time-deflection profiles and measure the resulting forces. As one of skill in the art will appreciate, polymers may exhibit a wide range of unique characteristic or non-linear stiffness regimes, and the present invention is not limited to the simple relationship shown in FIG. 4E. Alternate relationships may include non-linear stiffness regimes that remain substantially constant for large deflections, and stiffness regimes with minimal stiffness at, or completely slack (i.e. nearly zero effective stiffness since the material is not strained in the slack state), to a strained state, etc.

9. Electroactive Polymers and Electrodes

Having discussed suitable systems and techniques for providing variable stiffness and damping using an electroactive polymer transducer or device, several suitable transducer materials and device designs will now be expanded upon.

In one embodiment, materials suitable for use as an electroactive polymer with the present invention may include any substantially insulating polymer or rubber (or combination thereof) that deforms in response to an electrostatic force or whose deformation results in a measurable electric change. One suitable material is NuSil CF19-2186 as provided by NuSil Technology of Carpenteria, Calif. Other exemplary materials suitable for use include silicone elastomers such as those provided by Dow Corning of Midland, Mich., acrylic elastomers such as 3M Corporation's VHB 4910 acrylic adhesive, polyurethanes, thermoplastic elastomers, copolymers comprising PVDF, fluoroelastomers, and the like. Combinations of some of these materials may also be used as the electroactive polymer in transducers of this invention.

An electroactive polymer of the present invention may have a wide range of thicknesses. In one embodiment, polymer thickness may range between about 1 micrometer and 2 millimeters. Polymer thickness may be reduced by stretching the film in one or both planar directions. In many cases, electroactive polymers of the present invention may be fabricated and implemented as thin films. Thicknesses suitable for these thin films may be below 100 micrometers.

Although the discussion so far has focused primarily on one type of electroactive polymer commonly referred to as dielectric elastomers (polymer 12 of FIG. 1A), transducers of the present invention may also incorporate other electroactive polymers. As the term is used herein, an electroactive polymer generally refers to a polymer that responds to electrical stimulation. Other common classes of electroactive polymer suitable for use with some embodiments of the present invention include electrostrictive polymers, and conductive electroactive polymers. Electrostrictive polymers are conventionally described as polymers with an intrinsic strain response proportional to the square of the electric field. Conductive polymers are polymers that can conduct electricity. Conductive polymers include electronically conductive polymers as well as ionically conductive polymers. Ionic polymers are polymers that can conduct ions and are often wet to enhance ion mobility. Numerous examples of each type are known in the literature.

In one embodiment, an electroactive polymer of the present invention is pre-strained. Pre-strain of a polymer may be described, in one or more directions, as the change in dimension in a direction after pre-straining relative to the dimension in that direction before pre-straining. The pre-strain may comprise elastic deformation of polymer 12 (FIG. 1A) and be formed, for example, by stretching the polymer in tension and fixing one or more of the edges while stretched. For many polymers, pre-strain increases the maximum amount of energy conversion between electrical and mechanical energy. It also allows for the production of thin uniform films which allows for greater conversion at reduced voltages. In one embodiment, prestrain improves the dielectric strength of the polymer. In another embodiment, the pre-strain is elastic. After actuation, an elastically pre-strained polymer could, in principle, be unfixed and return to its original state. The pre-strain may be imposed at the boundaries using a rigid frame or may also be implemented locally for a portion of the polymer.

In one embodiment, pre-strain is applied uniformly over a portion of polymer 12 to produce an isotropic pre-strained polymer. For example, an acrylic elastomeric polymer may be stretched by 200 to 400 percent in both planar directions. In another embodiment, pre-strain is applied unequally in different directions for a portion of polymer 12 to produce an anisotropic pre-strained polymer. Generally, after the polymer is pre-strained, it may be fixed to one or more objects. Each object is preferably suitably stiff to maintain the level of pre-strain desired in the polymer. The polymer may be fixed to the one or more objects according to any conventional method known in the art such as a chemical adhesive, an adhesive layer or material, mechanical attachment, etc. Pre-strain suitable for use with the present invention is further described in copending U.S. patent application Ser. No. 09/619,848, which is incorporated by reference for all purposes.

Materials used as a pre-strained polymer may be selected based on one or more material properties such as a high electrical breakdown strength, a low modulus of elasticity—(for large or small deformations), a high dielectric constant, etc. In one embodiment, the polymer is selected such that is has an elastic modulus at most about 100 MPa. In another embodiment, the polymer is selected such that is has a maximum actuation pressure between about 0.05 MPa and about 10 MPa, and preferably between about 0.3 MPa and about 3 MPa. In another embodiment, the polymer is selected such that is has a dielectric constant between about 2 and about 20, and preferably between about 2.5 and about 12. For some applications, an electroactive polymer is selected based on one or more application demands such as a wide temperature and/or humidity range, repeatability, accuracy, low creep, reliability and endurance. Often, halogenated polymers, such as fluorinated or chlorinated polymers, exhibit a higher dielectric constant than the base polymer. In one example, a high dielectric polyurethane may be made from partially fluorinated urethane monomers.

Transducers of the present invention are not limited to any particular shape, geometry, or type of transducer deflection. For example, a polymer and electrodes may be formed into any geometry or shape including tubes and rolls, stretched polymers attached between multiple rigid structures, stretched polymers attached across a frame of any geometry—including curved or complex geometries, across a frame having one or more joints, etc. Deflection of a transducer according to the present invention includes linear expansion and compression in one or more directions, bending, axial deflection when the polymer is rolled, deflection out of a hole provided on a substrate, etc. Deflection of a transducer may be affected by how the polymer is constrained by a frame or rigid structures attached to the polymer. Deflection may also be produced by use of a separate coupling mechanism. This mechanism can be a mechanical linkage or a fluid-filled chamber that applies a pressure on a region of the polymer.

Generally, electrodes suitable for use with the present invention may be of any shape and material provided that they are able to supply a suitable voltage to an electroactive polymer. The voltage may be either constant or varying over time. In one embodiment, the electrodes adhere to a surface of the polymer. As electroactive polymers of the present invention may deflect at high strains, electrodes attached to the polymers should also deflect without compromising mechanical or electrical performance. Correspondingly, the present invention may include compliant electrodes that conform to the changing shape of an electroactive polymer to which they are attached. The electrodes may be only applied to a portion of an electroactive polymer and define an active area according to their geometry.

In one embodiment, compliant electrodes of the present invention comprise a conductive grease such as carbon grease or silver grease. The conductive grease provides compliance in multiple directions. Particles may be added to increase the conductivity of the polymer. By way of example, carbon particles may be combined with a polymer binder such as silicone to produce a carbon grease that has low elasticity and high conductivity. Other materials may be blended into the conductive grease to alter one or more material properties. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

Compliant electrodes of the present invention may also include colloidal suspensions. Colloidal suspensions contain submicrometer sized particles, such as graphite, silver and gold, in a liquid vehicle. Generally speaking, any colloidal suspension having sufficient loading of conductive particles may be used as an electrode in accordance with the present invention. In a specific embodiment, a conductive grease including colloidal sized conductive particles is mixed with a conductive silicone including colloidal sized conductive particles in a silicone binder to produce a colloidal suspension that cures to form a conductive semi-solid.

In another embodiment, compliant electrodes are achieved using a high aspect ratio conductive material such as carbon fibrils and carbon nanotubes. Mixtures of ionically conductive materials may be used for the compliant electrodes. Various other types of electrodes suitable for use with the present invention are described in copending U.S. patent application Ser. No. 09/619,848, which was incorporated by reference above. Electrodes described therein and suitable for use with the present invention include structured electrodes comprising metal traces and charge distribution layers and textured electrodes comprising varying out of plane dimensions.

Electronic drivers are typically connected to the electrodes. The voltage provided to electroactive polymer will depend upon specifics of an application. In one embodiment, a transducer of the present invention is driven electrically by modulating an applied voltage about a DC bias voltage. Modulation about a bias voltage allows for improved sensitivity and linearity of the transducer to the applied voltage.

When used for actuation, suitable actuation voltages for electroactive polymers, or portions thereof, may vary based on the material properties of the electroactive polymer (e.g., dielectric constant) and the dimensions of the polymer (e.g., polymer film thickness). For example, actuation electric fields used to actuate polymer 12 in FIG. 1A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example.

10. Electroactive Polymer Devices

An electroactive polymer transducer can be configured in a variety of ways to produce or receive mechanical energy or otherwise apply changes in stiffness and damping. Generally speaking, transducers of the present invention may be implemented with a variety of devices—including conventional devices retrofitted with an electroactive polymer and custom devices specially designed for one or more polymers. Conventional actuators include extenders, bending beams (FIGS. 4A–B), stacks, rolls, diaphragms, etc. Several different exemplary devices suitable for use with some sensors of the present invention will now be discussed. Additional actuators suitable for use with various embodiments of the present invention are described in copending U.S. patent application Ser. No. 09/619,848, which was incorporated by reference above.

Figure 5A:
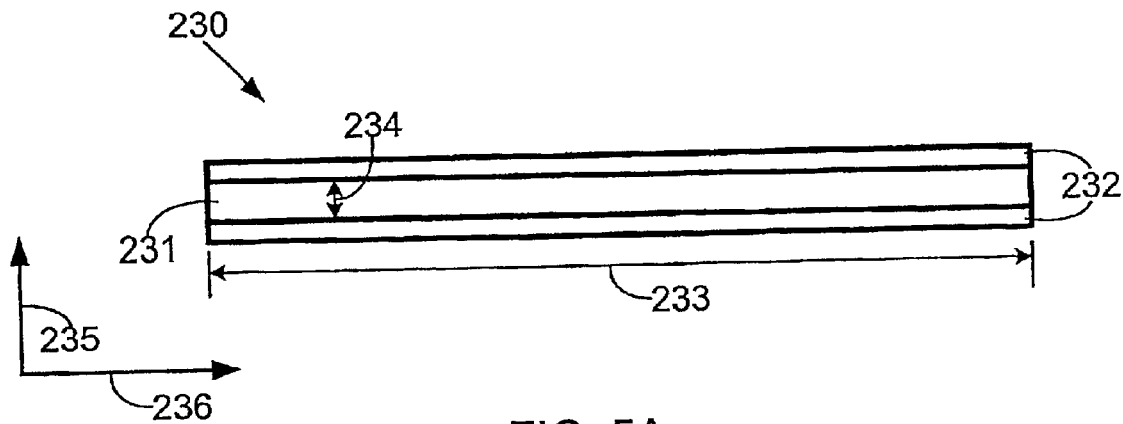
FIGS. 5A and 5B illustrate a linear motion device suitable for stiffness and damping control in a single direction, in accordance with one embodiment of the present invention.
Figure 5B:
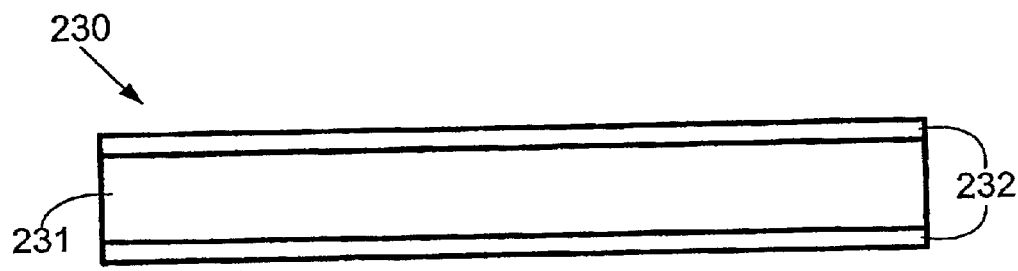
Figure 5C:
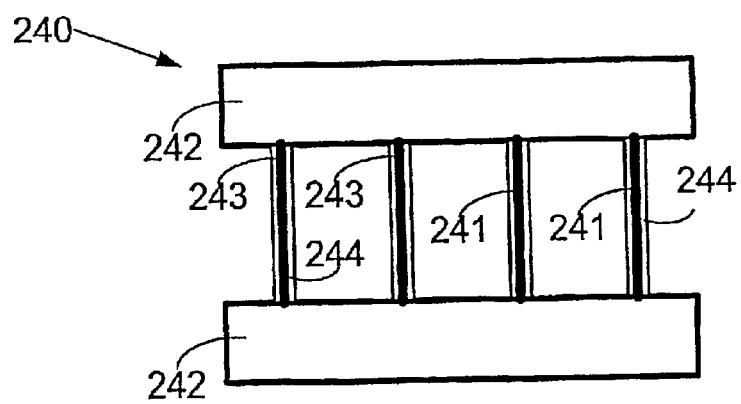
FIG. 5C illustrates cross-sectional side view of a multi-layer device for providing stiffness and damping control in accordance with one embodiment of the present invention.

A straightforward electroactive polymer device is one where the transducer acts as a linear actuator in much the same way as a conventional pneumatic or hydraulic cylinder might be employed. The device may also be used in generator or sensor mode as described above. FIGS. 5A–5C illustrate several linear electroactive polymer actuators suitable for use with the present invention.

The shape and constraint of an electroactive polymer may affect deflection. An aspect ratio for an electroactive polymer is defined as the ratio of its length to width. If the aspect ratio is high (e.g., an aspect ratio of at least about 4:1) and the polymer is constrained along its length by rigid members, than the combination may result in a substantially one-dimensional deflection in the orthogonal planar direction.

FIGS. 5A and 5B illustrate a linear motion device 230 suitable for stiffness and damping control in a single direction 235, before and after deflection, respectively. The linear motion device 230 is a planar mechanism having mechanical deflection in one direction. The linear motion device 230 comprises a polymer 231 having a length 233 substantially greater than its width 234 (e.g., an aspect ratio at least about 4:1). The polymer 231 is attached on opposite sides to stiff members 232 of a device along its length 233. The stiff members 232 have a greater stiffness than the polymer 231. The geometric edge constraint provided by the stiff members 232 substantially prevents displacement in a direction 236 along the polymer length 233 and facilitates deflection almost exclusively in direction 235. When the linear motion actuator 230 is implemented with a polymer 231 having anisotropic pre-strain, such as a higher pre-strain in the direction 236 than in the direction 235, then the polymer 231 is stiffer in the direction 236 than in the direction 235 and large actuated deflections in the direction 235 may result. Stiff members 232 also allow mechanical attachment and interface of moving parts with device 230.

Linear strain and area strain may be used to describe the deflection of a pre-strained polymer. As the term is used herein, linear strain of a pre-strained polymer refers to the deflection per unit length along a line of deflection relative to the unactuated state. Maximum linear strains (tensile or compressive) of at least about 50 percent are common for pre-strained polymers of the present invention. Of course, a polymer may deflect with a strain less than the maximum, and the strain may be adjusted by adjusting the applied voltage. For some pre-strained polymers, maximum linear strains of at least about 100 percent are common. For polymers such as VHB 4910 as produced by 3M Corporation of St. Paul, Minn., maximun linear strains in the range of 40 to 215 percent are common. Area strain of an electroactive polymer refers to the change in planar area, e.g. the change in the plane defined by directions 108 and 110 in FIGS. 1A and 1B, per unit area of the polymer upon actuation relative to the unactuated state. Maximum area strains of at least abont 100 percent are possible for pre-strained polymers of the present invention. For some pre-strained polymers, maximum area strains in the range of 70 to 330 percent are common.

A collection of electroactive polymers or devices may be mechanically linked to form a larger device with scaled performance, e.g. force and/or displacement. By using a small electroactive polymer transducer as a base unit in a collection, stiffness and damping control may be scaled according to an application. FIG. 5C illustrates cross-sectional side view of a multilayer device 240 for providing stiffness and damping control in accordance with one embodiment of the present invention. The multilayer device 240 includes four polymers 241 arranged in parallel and each attached to a rigid member 242 such that they have the same deflection. Electrodes 243 and 244 are deposited on opposite surfaces of each polymer 241 and are in electrical communication such that they provide simultaneous electrostatic actuation/generation to polymers 241. Rigid members 242 allow mechanical interface between polymers 241 and an external mechanical load.

The multilayer device 240 provides cumulative stiffness and damping control of the individual polymer layers 241. In one embodiment, electrodes 243 and 244 and their associated control electronics are configured to provide synchronous control for polymers 241. In another embodiment, electrodes 243 and 244 and their associated control electronics are configured to provide separate control for each polymer 241. In this manner, one may use simple on/off voltage control to independently provide stiffness control for each polymer 241. This binary independent on/off control allows a user relatively simple graduated stiffness control for device 240 since the effective stiffness is the sum of the stiffnesses of the individual polymer elements 241.

Another linear device suitable for use with the present invention was described in FIGS. 4C–4D. In another embodiment, electroactive polymers suitable for use the present invention may be rolled or folded into linear transducers and devices that deflect axially. As fabrication of electroactive polymers is often simplest with fewer numbers of layers, rolled actuators provide an efficient manner of squeezing large layers of polymer into a compact shape. Rolled or folded transducers and devices typically include two or more layers of polymer. Rolled or folded devices are applicable wherever linear devices are used, such as robotic legs and fingers.

Generally, devices of the present invention comprise a mechanical interface that transfers forces between the polymer and an external load. For example, any one or more of the rigid members 204 of device 200 may be coupled to a vibrating structure. Alternately, any of the rigid members included at the distal end of a linear transducer may be used for external mechanical attachment and interface with a reciprocating rigid member. The external load need not be a solid structure. For example, a mass attached to the center of an electroactive polymer diaphragm may be used as the mechanical interface to transfer mechanical energy between the diaphragm and a fluid source.

11. Multifunctionality

For ease of understanding, the present invention has primarily been described and shown by focusing on a single electroactive polymer function—providing stiffness or damping. However, electroactive polymer transducers have other functional uses such as actuation, generation and sensing. In one aspect, devices of the present invention may be integrated with other electroactive polymer functions. Electroactive polymer transducers and their associated devices configured to have more than one function are referred to herein as 'multifunctional'.

Some transducers and devices of the present invention may also be configured or designed for use as an actuator to produce mechanical output in addition to providing stiffness and/or damping control. In this case, the transducer is also arranged in a manner which causes a portion of the polymer to deflect in response to a change in electric field provided by the at least two electrodes. Suitable electroactive polymer actuators are further described in Ser. No. 09/619,848, which was previously incorporated by reference. Transducers and devices that provide actuation and stiffness or damping control are well suited for use in macro and micro robotics, for example.

In a specific multifunctional application, higher frequency vibrations may be damped out on a robot arm using filtering, e.g., using the classical description of closed loop systems described above. However, one may also apply co-contraction on a robot arm where two or more actuators exert opposing forces on a single robotic link. This ability to load, or preload, polymers against each other allows a robotic system to achieve stiffness control by several methods described herein such as stiffness regime or open or closed loop methods.

Another common electroactive polymer transducer function is converting mechanical to electrical energy—or generation. The mechanical energy may be harvested from a mechanical source that is deflecting the polymer, such as a vibrating source. Thus, some systems of the present invention may also be configured or designed for use as a generator to produce electrical energy. Typically, a generator of the present invention comprises a polymer arranged in a manner that causes a change in electric field in response to deflection of a portion of the polymer. The change in electric field, along with changes in the polymer dimension in the direction of the field, produces an increase in voltage, and hence an increase in electrical energy. The increase in electrical energy may be harvested and stored by generation circuitry in electrical communication with the electrodes. Suitable electroactive polymer generator circuits are further described in Ser. No. 09/792,877, which is incorporated herein by reference for all purposes.

Open and closed loop control systems may also include provisions to harvest some of the generated energy in the polymer rather than just dumping it through a resistor. For example, the open loop control can include transformer elements to transform some of the power down to a low voltage suitable for microprocessors and other low voltage IC components. In this case, the device can be self-powered, using a small battery to store and recycle the energy for start-up. In a specific embodiment, an electroactive polymer is configured as a shock absorber (controllable stiffness and damping mechanism) that harvests some of the energy that is absorbed.

As described above, yet another electroactive polymer transducer function is sensing. Thus, transducers of the present invention may be configured to provide variable stiffness and/or damping, actuation to convert from electrical to mechanical energy, generation to convert from mechanical to electrical energy, sensing to detect changes in a parameter, or any combination thereof.

12. Applications

As the present invention includes transducers and systems that may be implemented in both the micro and macro scales, implemented in applications where stiffness and/or damping is desirable, and implemented with a wide variety of designs, the present invention finds use in a broad range of applications. Provided below are several exemplary applications.

Variable stiffness electroactive polymer devices and systems are well-suited for use as noise and vibration controls. For example, noise control depends on minimizing the net volume acceleration of a vibrating surface. Variable stiffness transducers of the present invention may be placed on vibrating surfaces to actively (closed loop) or passively (open loop) resist motion. For closed loop control, the vibration control may comprise repeatedly a) actuating the polymer out of phase from motion of the vibrating surface that causes the polymer to contract, and b) absorbing electrical energy in generator mode out of phase from motion of the vibrating surface that causes the polymer to expand.

Variable stiffness can be used in open loop vibration control. For example, in an engine mount, the engine piston firing frequency is known; thus allowing a device that provides an open loop stiffness that shifts the engine mount resonant frequency to temper oscillations. Similarly for aircraft and turbine blades, the stiffness/damping could be adjusted to prevent the resonance frequency of the blades from coinciding with the rotation frequency or harmonics.

In one embodiment, electroactive polymers of the present invention are disposed in footwear, such as a shoe, to vary the stiffness of one or more portions of the shoe. There is a wide range of functional stiffness and damping control applications for electroactive polymers in footwear. For example, electroactive polymers disposed in the heel of the shoe may be used to vary the stiffness of the heel. The stiffness may then be controlled or manipulated to affect locomotion for a person, such as to improve walking or running. Stiffness of the polymers may then be tuned to achieve a particular performance of the footwear desirable to an application or the characteristics of the wearer, such as a high stiffness for running or for use with a heavier person. Provided below are additional exemplary applications for electroactive polymers within footwear.

As the term is used herein, footwear generally refers to any covering or attachment for a foot. This may include walking shoes; running shoes; athletic shoes for a particular sport such as soccer shoes, football shoes, tennis shoes; fashion footwear including women's shoes of varying shapes and designs; sandals; snowshoes; boots such as work boots; impact protection footwear; ski and snowboarding boots; and so on. Common parts of footwear may include a sole, a heel, a toe portion, etc. One of skill in the art will recognize the wide array of footwear currently available, and the present invention is not intended to be limited to any the footwear examples provided herein for illustrative purposes.

Figure 6:
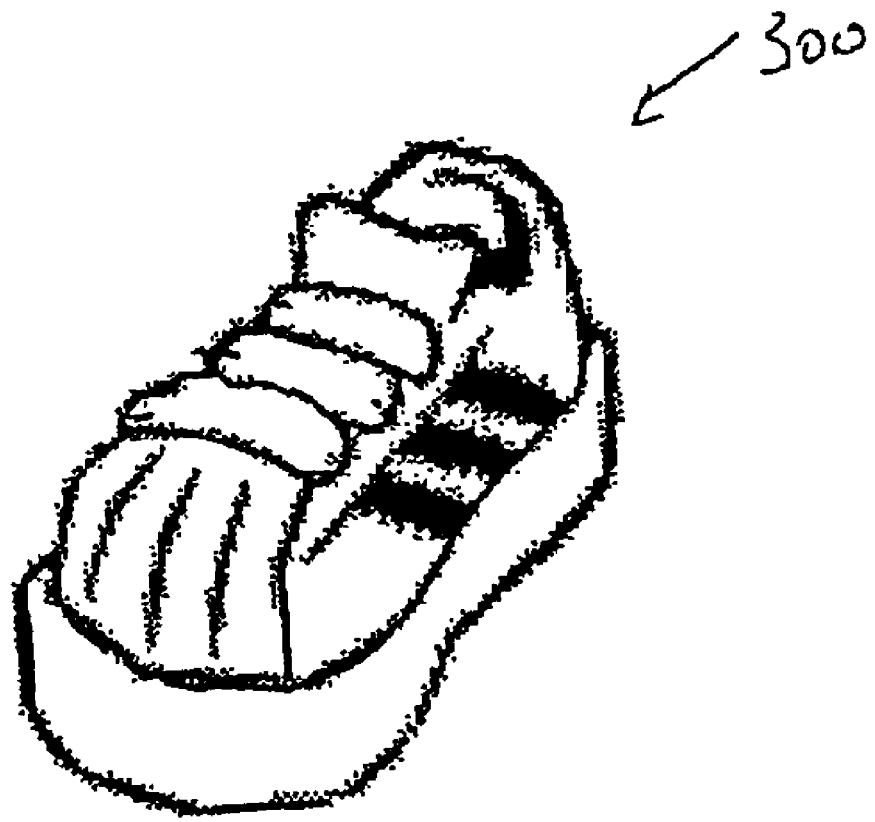
FIG. 6 illustrates multiple linear transducers configured to vary the stiffness of a top portion of shoe in accordance with one embodiment of the present invention.

In some designs, control electronics and transducers are configured to provide variable stiffness for one or more portions of a shoe, such as show 300 as shown in FIG. 6. This may include varying the stiffness of different parts, such as the sidewalls of hightop footwear, or the upper portion of footwear affected by laces, of footwear 300 for different times of usage. For example, shoes for daily wear may have a heel that decreases in stiffness when the shoe is not being, e.g., when a person is relaxing at a desk, but increases when the shoe is being used, e.g., for locomotion. Air or fluid filled sacs having an exterior comprising an electroactive polymer that varies in stiffness may be disposed in a heel to vary stiffness as desired. As transducers of the present invention may be manufactured in a wide variety of custom shapes and designs, the configuration of an electroactive polymer transducer in a shoe will vary with design, as one of skill in the art will appreciate. Different portions of the shoe other than the heel may relax and increase in stiffness in this manner. In a specific embodiment, a transducer is employed to vary the stiffness provided by an insole disposed in the shoe. Stiffness of various portions of the shoe may also vary based on user preferences or sensed features of the environment, e.g., stiffness is controlled depending on ground conditions such as sand, asphalt, rocks, etc., or may vary based on the mode of locomotion, e.g., a different stiffness for walking than for running or resting. It is well-known that tuning the stiffness and damping of a shoe to accommodate for changes in stiffness and damping of the environment experienced while walking or running, for example, can enhance the efficiency of the locomotion.

Electrical power for the electroactive polymers disposed in a shoe may come from a variety of sources. In one embodiment, a battery or fixed power supply is provided in the footwear to provide electrical energy. In another embodiment, an electroactive polymer generator disposed in the footwear provides at least partial power to actuate an electroactive polymer. In some cases, the generator polymer may be the same as the polymer providing the variable stiffness. The mechanical power may be generated during heel strike (to expand a polymer) and relaxation process may correspond to a person lifting their foot after it has struck the ground. As the polymer relaxes, the voltage of the charge on the polymer film is increased. The increase in charge's electrical energy, as indicated by its higher voltage, on the polymer film is harvested to generated electrical energy. In another embodiment, a battery in electrical communication with the electroactive polymer provides at least partial power to actuate the electroactive polymer.

In another aspect, variable stiffness/damping systems of the present invention are well-suited for use in robotics. In a distributed robotic scheme, multiple links are used wherein each link has its own drive, thus allowing a separate control for each link; and therefore independent dexterity for the entire device. In this scheme, an actuator (polymer based or other) is often required to move and support distal links that each include the added mass of a downlink actuator. Light-weight electroactive polymer transducers that provide actuation, and stiffness control, are clearly advantageous over heavier conventional actuators. One of skill in the art will appreciate the value of light weight in robotics, particularly when the robotic links are required to move at high speeds.

The ability to modulate the stiffness and damping about a robotic joint also allows for the implementation of impedance control schemes. Such control schemes have been shown to enable tasks that require dexterity that is not available with conventional actuators, such as motors operating through non-backdrivable transmission elements. The electroactive polymer transducers more closely approximate the behavior of natural muscle. It is well-known that biological creatures use the variable stiffness capability of muscle to enhance dexterity or locomotion efficiency.

Another area, closely related to robotics is prosthetic or orthotic devices for humans or other animals. For example, a prosthetic arm could include actuators where the stiffness of the actuators is adjustable. it is well-known that humans and other biological creatures adjust the apparent stiffness depending on the task to be accomplished. An example of an orthotic device is a brace where the transducers provide damping of vibrations caused by tremors.

13. Conclusion

While this invention has been described in terms of several preferred embodiments, there are alterations, permutations, and equivalents that fall within the scope of this invention which have been omitted for brevity's sake. By way of example, although the present invention has been described in terms of several numerous applied material electrodes, the present invention is not limited to these materials and in some cases may include air or liquids as an electrode. In addition, although the stiffness and damping techniques have been described independently, it is understood that many of the techniques may be combined such as systems that implement both stiffness regime and open loop control. In other words, although the ability to control stiffness and damping has been described separately in most of the embodiments provided above, it will be apparent to those skilled in the art that one could simultaneously select the desired stiffness and damping. More generally, one could select the desired mechanical impedance. It is therefore intended that the scope of the invention should be determined with reference to the appended claims.

What is claimed is:

1. A system for providing a desired stiffness using an electroactive polymer transducer, the system comprising:

a device comprising
a mechanical interface capable of displacement,
a transducer comprising at least two electrodes, and an electroactive polymer in electrical communication with the at least two electrodes and coupled to the mechanical interface, the polymer arranged in a manner that allows deflection of the polymer corresponding to displacement of the mechanical interface wherein the polymer has an elastic modulus at most about 100 MPa; and
control electronics in electrical communication with the at least two electrodes and designed or configured to set or change an electrical state of the transducer in order to cause a corresponding setting or change in the stiffness of the device.

2. The system of claim 1 wherein the control electronics comprise a voltage source in electrical communication with the at least two electrodes.

3. The system of claim 2 wherein the control electronics are configured to vary the voltage provided to the at least two electrodes.

4. The system of claim 2 wherein the voltage source is a high voltage source that supplies a voltage greater than 200 Volts.

5. The system of claim 1 wherein the device is configured such that displacement of the mechanical interface increases electrical energy within one of the transducer and the control electronics.

6. The system of claim 1 wherein the control electronics comprise a logic device configured to set or change the electrical state.

7. The system of claim 1 wherein the control electronics comprise an open loop control designed or configured to set or change the electrical state.

8. The system of claim 7 wherein the control electronics comprise a buffer capacitor.

9. The system of claim 8 wherein the buffer capacitor has a larger capacitance than a capacitance of the transducer for zero deflection of the transducer.

10. The system of claim 7 wherein the open loop control allows substantially free flow of charge to and from the transducer.

11. The system of claim 7 wherein the control electronics are configured to set or change a substantially constant charge that is provided to the at least two electrodes.

12. The system of claim 7 wherein the control electronics are configured to set or change a substantially constant voltage that is provided to the at least two electrodes.

13. The system of claim 7 wherein the open loop control comprises one of a transistor, triac, or relay.

14. The system of claim 1 wherein the system is further designed or configured to provide one of actuation, generation, and sensing.

15. The system of claim 14 wherein the device is designed or configured such that a first active area of the transducer provides the desired stiffness of the device and a second active area of the transducer provides the one of actuation, generation, and sensing.

16. The system of claim 1 wherein the system is further configured to provide damping, the system comprising:
dissipative electronics in electrical communication with the at least two electrodes and designed or configured to dump electrical energy in response to a change in the electrical state.

17. The system of claim 16 wherein the dissipative electronics comprise a resistor.

18. The system of claim 17 wherein the resistor has a resistance that produces an RC time constant for the resistor and the transducer in the range of about 0.1 to about 4 times a frequency of interest.

19. The system of claim 17 wherein the resistor has a resistance that produces an RC time constant for the resistor and the transducer in the range of about 2 to about 100 times a frequency of interest.

20. The system of claim 19 wherein the resistor has a resistance that produces an RC time constant for the resistor and the transducer in the range of about 5 to about 30 times a frequency of interest.

21. The system of claim 17 wherein the control electronics are designed or configured to provide stiffness control of the device independent from damping control.

22. The system of claim 17 wherein the resistor is a variable resistor.

23. The system of claim 1 wherein the device stiffness changes with polymer deflection.

24. The system of claim 23 wherein the device stiffness changes as a result of a shape change in the polymer related to the polymer deflection.

25. The system of claim 23 wherein the device stiffness changes as a result of a structural change in the device related to the polymer deflection.

26. The system of claim 1 wherein the control electronics are further configured or designed to apply an electrical state that places the polymer in a stiffness regime that provides a desired stiffness for the device.

27. The system of claim 1 wherein the electroactive polymer is a dielectric elastomer.

28. A system for providing damping using an electroactive polymer transducer, the system comprising:
a device comprising
a mechanical interface capable of displacement,
a transducer comprising at least two electrodes, and an electroactive polymer in electrical communication with the at least two electrodes and coupled to the mechanical interface, the polymer arranged in a manner that allows deflection of the polymer corresponding to displacement of the mechanical interface wherein the polymer has an elastic modulus at most about 100 MPa; and
control electronics in electrical communication with the at least two electrodes and designed or configured to set or change an electrical state of the transducer; and
dissipative electronics in electrical communication with the at least two electrodes and designed or configured to dump electrical energy in response to a change in the electrical state.

29. The system of claim 28 wherein the dissipative electronics comprise a resistor.

30. The system of claim 29 wherein the resistor has a resistance that produces an RC time constant for the resistor and the transducer in the range of about 0.1 to about 4 times a frequency of interest.

31. The system of claim 28 wherein the dissipative electronics store the electrical energy produced in response to a change in the electrical state.

32. The system of claim 28 wherein the dissipative electronics dump electrical energy in response to displacement of the mechanical interface.

33. The system of claim 28 wherein the control electronics are designed or configured to provide stiffness control of the device independent from damping control.

34. The system of claim 29 wherein the control electronics comprise a variable resistor.

35. The system of claim 28 wherein the control electronics are designed or configured to set or change the electrical state of the transducer in order to cause a corresponding setting or change in the stiffness of the device.

36. The system of claim 28 wherein the control electronics comprise a voltage source in electrical communication with the at least two electrodes and the control electronics are configured to apply a voltage to the at least two electrodes.

37. The system of claim 35 wherein the control electronics comprise an open loop control designed or configured to set or change the electrical state.

38. The system of claim 37 wherein the control electronics comprise a buffer capacitor.

39. The system of claim 38 wherein the buffer capacitor has a larger capacitance than a capacitance of the transducer for zero deflection of the transducer.

40. The system of claim 37 wherein the control electronics are configured to set or change a substantially constant charge that is provided to the at least two electrodes.

41. The system of claim 37 wherein the dissipative electronics dump electrical energy during elastic return of the polymer from a stretched position.

42. A system for providing a desired stiffness using an electroactive polymer transducer, the system comprising:
a device comprising
a mechanical interface capable of displacement,
a transducer comprising at least two electrodes, and an electroactive polymer in electrical communication with the at least two electrodes and coupled to the mechanical interface, the polymer arranged in a manner that allows deflection of the polymer corresponding to displacement of the mechanical interface wherein the polymer has an elastic modulus at most about 100 MPa; and
open loop control electronics in electrical communication with the at least two electrodes and designed or configured to set or change an electrical state of the transducer in order to cause a corresponding setting or change in the stiffness of the device.

43. The system of claim 42 wherein the control electronics are configured to set or change a substantially constant charge that is provided to the at least two electrodes.

44. The system of claim 42 wherein the control electronics comprise a voltage source in electrical communication with the at least two electrodes.

45. The system of claim 44 wherein the control electronics are configured to vary the voltage provided to the at least two electrodes.

46. The system of claim 44 wherein the voltage source is a high voltage source that supplies a voltage greater than 200 Volts.

47. The system of claim 42 wherein displacement of the mechanical interface increases electrical energy within one of the transducer and the control electronics.

48. The system of claim 42 wherein the control electronics comprise a buffer capacitor.

49. The system of claim 48 wherein the buffer capacitor has a larger capacitance than a capacitance of the transducer for zero deflection of the transducer.

50. The system of claim 48 wherein the open loop control allows current to freely flow to and from the transducer.

51. The system of claim 42 wherein the system is further designed or configured to provide one of actuation, generation, and sensing.

52. The system of claim 42 wherein the control electronics are configured to set or change a substantially constant voltage that is provided to the at least two electrodes.

53. The system of claim 42 wherein the open loop control comprises a transistor, triac, or relay.

54. The system of claim 42 wherein the system is configured to influence the resonant frequency of a mechanical system.

55. A system for providing a desired stiffness using an electroactive polymer transducer, the system comprising:
a device comprising
a mechanical interface capable of displacement,
a transducer comprising at least two electrodes, and an electroactive polymer in electrical communication with the at least two electrodes and coupled to the mechanical interface, the polymer arranged in a manner that allows deflection of the polymer corresponding to displacement of the mechanical interface wherein the polymer has an elastic modulus at most about 100 MPa;
control electronics in electrical communication with the at least two electrodes and designed or configured to set or change an electrical state of the transducer in order to cause a corresponding setting or change in the stiffness of the device; and
a sensor configured to detect a parameter related to the desired stiffness and provide feedback to the control electronics.

56. The system of claim 55 wherein the parameter is displacement of the mechanical interface.

57. The system of claim 55 wherein the control electronics comprise a voltage source in electrical communication with the at least two electrodes.

58. The system of claim 57 wherein the control electronics are configured to vary a voltage provided to the at least two electrodes.

59. The system of claim 57 wherein the voltage source is a high voltage source that supplies a voltage greater than 200 Volts.

60. The system of claim 55 wherein the control electronics further comprise a logic device configured to set or change the electrical state.

61. The system of claim 55 wherein the control electronics are configured to set or change the charge provided to the at least two electrodes.

62. The system of claim 55 wherein the mechanical interface is configured to transfer mechanical energy between the polymer and a fluid source.

63. The system of claim 55 wherein the system is further designed or configured to provide damping, the system comprising:
dissipative electronics in electrical communication with the at least two electrodes and designed or configured to dump electrical energy in response to a change in the electrical state.

64. The system of claim 63 wherein the dissipative electronics comprise a resistor.

65. The system of claim 64 wherein the resistor is a variable resistor.

66. The system of claim 65 wherein the control electronics are designed or configured to provide stiffness control of the device independent from damping control.

67. A system for providing a desired stiffness using an electroactive polymer transducer, the system comprising:
a device comprising
a transducer comprising at least two electrodes, and an electroactive polymer in electrical communication with the at least two electrodes; and
control electronics in electrical communication with the at least two electrodes and designed or configured to set or change an electrical state that results in a desired deflection for the polymer, the desired deflection corresponding to a structural state of the device that results in the desired stiffness for the device, wherein the polymer has an elastic modulus at most about 100 MPa.

68. The system of claim 67 wherein the desired deflection for the polymer corresponds to a polymer shape that results in the desired stiffness of the device.

69. The system of claim 67 wherein the polymer shape comprises a bent portion.

70. The system of claim 67 wherein the electroactive polymer is a dielectric elastomer.

71. The system of claim 67 wherein the device comprises two rigid members whose position relative to each other changes with polymer deflection.

72. The system of claim 67 wherein the desired deflection results from actuation using the electrodes.

73. The system of claim 67 wherein the control electronics comprise a high voltage source in electrical communication with the at least two electrodes that supplies a voltage greater than 200 Volts.

74. A system for providing damping using an electroactive polymer transducer, the system comprising:
a device comprising
a mechanical interface capable of displacement,
a transducer comprising at least two electrodes, and an electroactive polymer in electrical communication with the at least two electrodes and coupled to the mechanical interface, the polymer arranged in a manner that allows deflection of the polymer corresponding to displacement of the mechanical interface wherein the polymer has an elastic modulus at most about 100 MPa;
an open loop control source in electrical communication with the at least two electrodes and designed or configured to set or change an electrical state that results in a desired damping for the device; and
dissipative electronics in electrical communication with the at least two electrodes and designed or configured to dump electrical energy in response to a change in the electrical state.

75. The system of claim 74 wherein the open loop control is further designed or configured to set or change an electrical state that results in a desired stiffness for the device.

76. The system of claim 74 wherein the dissipative electronics comprise a resistor.

77. The system of claim 76 wherein the resistor has a resistance that produces an RC time constant for the resistor and the transducer in the range of about 0.1 to about 4 times a frequency of interest.

78. A system for providing damping using an electroactive polymer transducer, the system comprising:
a device comprising
a mechanical interface capable of displacement,
a transducer comprising at least two electrodes, and an electroactive polymer in electrical communication with the at least two electrodes and coupled to the mechanical interface, the polymer arranged in a manner that allows deflection of the polymer corresponding to displacement of the mechanical interface wherein the polymer has an elastic modulus at most about 100 MPa;
dissipative electronics in electrical communication with the at least two electrodes and designed or configured to dump electrical energy in response to a change in the electrical state;
control electronics in electrical communication with the at least two electrodes and designed or configured to set or change an electrical state that results in a desired damping for the device; and
a sensor configured to detect a parameter related to the desired damping and provide feedback to the control electronics.

79. The system of claim 78 wherein the control electronics are further designed or configured to set or change an electrical state that results in a desired stiffness for the device.

80. The system of claim 78 wherein the control electronics further comprise a logic device configured to set or change the electrical state.

81. The system of claim 78 wherein the dissipative electronics comprise a resistor.

82. The system of claim 81 wherein the resistor is a variable resistor controlled by the logic device.

83. A method for providing a desired stiffness using an electroactive polymer transducer, the transducer comprising at least two electrodes and an electroactive polymer in electrical communication with the at least two electrodes, the method comprising applying a substantially constant voltage to the at least two electrodes using control electronics in electrical communication with the at least two electrodes wherein the polymer has an elastic modulus at most about 100 MPa.

84. The method of claim 83 wherein the substantially constant voltage is applied by a buffer capacitor and an open loop control in electrical communication with the at least two electrodes.

85. A method for providing a desired stiffness using an electroactive polymer transducer, the transducer comprising at least two electrodes and an electroactive polymer in electrical communication with the at least two electrodes, the method comprising applying a substantially constant charge to the transducer using control electronics in electrical communication with the at least two electrodes wherein the polymer has an elastic modulus at most about 100 MPa.

86. A method for providing a desired stiffness using an electroactive polymer transducer, the transducer comprising at least two electrodes and an electroactive polymer in electrical communication with the at least two electrodes, the method comprising applying an electrical state to the transducer, using control electronics in electrical communication with the at least two electrodes, that that places the polymer in a stiffness regime that provides the desired stiffness wherein the polymer has an elastic modulus at most about 100 MPa.

87. The method of claim 86 wherein the stiffness regime corresponds to a non-linear stiffness response of the polymer.

88. The method of claim 86 further comprising actuating the polymer to achieve the desired stiffness.

89. A system for providing a desired stiffness for a portion of footwear, the system comprising:
footwear designed or configured for human usage, the footwear comprising
a portion of the footwear capable of displacement,
a transducer comprising at least two electrodes, and an electroactive polymer in electrical communication with the at least two electrodes and coupled to the portion, the polymer arranged in a manner that allows deflection of the polymer corresponding to displacement of the portion wherein the polymer has an elastic modulus at most about 100 MPa; and
control electronics in electrical communication with the at least two electrodes and designed or configured to set or change an electrical state of the transducer in order to cause a corresponding setting or change in the stiffness of the footwear.

90. The system of claim 89 wherein the portion comprises a heel portion of the footwear.

91. The system of claim 89 wherein the stiffness is increased for locomotion of a person.

92. The system of claim 89 wherein the control electronics are configured to provide a stiffness within a certain range corresponding to a predetermined level of comfort.

93. A method for resisting motion of a mechanical interface included in a device, the device including an electroactive polymer transducer comprising at least two electrodes an electroactive polymer in electrical communication with the at least two electrodes and coupled to the mechanical interface, the method comprising: a) actuating the polymer out of phase from motion of the mechanical interface that causes the polymer to contract, and b) absorbing electrical energy in generator mode out of phase from motion of the mechanical interface that causes the polymer to expand wherein the polymer has an elastic modulus at most about 100 MPa.

94. The method of claim 93 wherein the motion of the mechanical interface is a vibratory motion.

95. The method of claim 93 further comprising dumping the electrical energy generated in generator mode.

96. A system for providing a desired stiffness using an electroactive polymer transducer, the system comprising:
   a device comprising
      a mechanical interface capable of displacement,
      a transducer comprising at least two electrodes, and an electroactive polymer in electrical communication with the at least two electrodes and coupled to the mechanical interface, the polymer arranged in a manner that allows deflection of the polymer corresponding to displacement of the mechanical interface wherein, during operation of the transducer a portion of the polymer is deflected and wherein the portion of the polymer has an elastic modulus below about 100 MPa; and
   control electronics in electrical communication with the at least two electrodes and designed or configured to set or change an electrical state of the transducer in order to cause a corresponding setting or change in the stiffness of the device.

* * * * *